United States Patent
Kim et al.

(10) Patent No.: US 12,359,777 B2
(45) Date of Patent: Jul. 15, 2025

(54) SELF GENERATION PRESSURE-SENSITIVE LIGHT EMITTING DEVICE AND METHOD THEREOF

(71) Applicant: IUCF-HYU (INDUSTRY-UNIVERSITY COOPERATION FOUNDATION HANYANG UNIVERSITY), Seoul (KR)

(72) Inventors: Do Hwan Kim, Seoul (KR); Joo Sung Kim, Seoul (KR); Han Bin Choi, Seoul (KR); Chi Hoon In, Seoul (KR); Sang Jun Park, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 0 days.

(21) Appl. No.: 18/687,289

(22) PCT Filed: Aug. 31, 2022

(86) PCT No.: PCT/KR2022/013010
§ 371 (c)(1),
(2) Date: Feb. 27, 2024

(87) PCT Pub. No.: WO2023/033533
PCT Pub. Date: Mar. 9, 2023

(65) Prior Publication Data
US 2025/0035270 A1 Jan. 30, 2025

(30) Foreign Application Priority Data
Aug. 31, 2021 (KR) .................. 10-2021-0115687

(51) Int. Cl.
*F21K 2/04* (2006.01)
*F21K 2/08* (2006.01)
*H02N 1/04* (2006.01)

(52) U.S. Cl.
CPC .............. *F21K 2/04* (2013.01); *F21K 2/08* (2013.01); *H02N 1/04* (2013.01)

(58) Field of Classification Search
CPC ................................. F21K 2/04; F21K 2/08
See application file for complete search history.

(56) References Cited

U.S. PATENT DOCUMENTS 6,630,793 B2 * 10/2003 Rubner ............... H10K 50/135
315/169.3
2007/0262694 A1 * 11/2007 Mikoshiba ............ H05B 33/20
313/483

(Continued)

FOREIGN PATENT DOCUMENTS

KR 101036213 B1 5/2011
KR 101718907 B1 3/2017
(Continued)

OTHER PUBLICATIONS

Yuichi Hirai et al. "Lifetimes of Lanthanide(III) Triboluminescence Excited by Aerodynamic Shock Waves", The Journal of Physical Chemistry. C2019, 123, pp. 27251-27256.

(Continued)

*Primary Examiner* — Joseph L Williams
(74) *Attorney, Agent, or Firm* — NKL Law; Jae Youn Kim

(57) ABSTRACT

Disclosed are a self-generating pressure-sensitive light-emitting device and a method of manufacturing the same. The self-generating pressure-sensitive light-emitting device includes an electrochemical light-emitting device in which a first electrode, a light-emitting layer and a second electrode are sequentially formed; and a triboelectric self-generating (Continued)

device formed on the second electrode and configured to share the second electrode of the electrochemical light-emitting device, wherein the electrochemical light-emitting device and the triboelectric self-generating device share the second electrode and thus the electrochemical light-emitting device is driven due to a potential difference generated from the triboelectric self-generating device.

14 Claims, 18 Drawing Sheets

(56) References Cited

U.S. PATENT DOCUMENTS

| | | | | |
|---|---|---|---|---|
| 2009/0244045 | A1* | 10/2009 | Saito | G09G 3/3233 345/211 |
| 2015/0242057 | A1* | 8/2015 | Galela | G06F 3/0421 345/175 |
| 2017/0244038 | A1* | 8/2017 | Yonekawa | H10K 85/60 |
| 2018/0249550 | A1* | 8/2018 | Wang | H05B 33/145 |
| 2019/0157992 | A1* | 5/2019 | Mallineni | H02N 11/002 |
| 2022/0140753 | A1* | 5/2022 | Uddin | H04B 1/3888 310/310 |
| 2022/0361810 | A1* | 11/2022 | Price | A61B 5/7405 |

FOREIGN PATENT DOCUMENTS

| | | |
|---|---|---|
| KR | 20170088737 A | 8/2017 |
| KR | 101825079 B1 | 1/2018 |
| KR | 20190007229 A | 1/2019 |
| KR | 20190084555 A | 7/2019 |
| KR | 102214474 B1 | 2/2021 |

OTHER PUBLICATIONS

Ye Liu et al. "Triboelectric-nanogenerator-inspired light-emitting diode-in-capacitors for flexible operation in high-voltage and wireless drive modes" Nano Energy 78 (2020) 105281, Jun. 9, 2020, total pp. 10.

Vol. 31, No. 5, ISSN: 2586-1476 (online), Oct. 2020 (Kim, Do Hwan. Frontier Optoelectronic Nanomaterials and Devices Lab., Hanyang University. In: Polymer Science and Technology.) pp. 420-421.

* cited by examiner

SELF GENERATION PRESSURE-SENSITIVE LIGHT EMITTING DEVICE AND METHOD THEREOF

CROSS-REFERENCE TO RELATED APPLICATION

This application is a National Stage Entry of PCT International Application No. PCT/KR2022/013010, which was filed on Aug. 31, 2022, and which claims priority to Korean Patent Application No. 10-2021-0115687, filed on Aug. 31, 2021 in the Korean Intellectual Property Office, the disclosure of which is incorporated herein by reference.

TECHNICAL FIELD

The present invention relates to a self-generating pressure-sensitive light-emitting device and a method of manufacturing the same, and more particularly to a self-generating pressure-sensitive light-emitting device where an electrochemical light-emitting device and a triboelectric self-generating device shares an electrode and power generated from the triboelectric self-generating device is transferred to the electrochemical light-emitting device to adjust the intensity of light emission according to the magnitude of external force; and a method of manufacturing the self-generating pressure-sensitive light-emitting device.

BACKGROUND ART

Pressure energy is generated when people press the soles of their feet against a floor whenever they walk, and vibration and heat energy are generated when cars, trains, and airplanes move. Energy harvesting means collecting such wasted energy and converting it into electricity.

In other words, energy harvesting is a technology that harvests small amounts of energy that are routinely discarded or unused and converts it into usable electrical energy. Vibration and heat from machines operating in factories or power plants, and electromagnetic waves from mobile phone base stations or broadcasting stations are continuously emitted, and, if this is not utilized, it will ultimately be converted to sound or heat and disappear into the air.

Electrostatic power generation can be used for such energy harvesting. Electrostatic power generation generates electricity through friction, and unlike existing eco-friendly energy sources such as solar cells, hydropower, and wind power, it can extract consumable mechanical energy generated during minute vibrations or movements that occur in the surroundings as electrical energy.

In the case of triboelectricity using the electrostatic phenomenon, energy is generated due to a difference in charging caused by static electricity occurring when two materials come into contact and then are separated. Triboelectricity is a new concept of eco-friendly energy generation method that can produce consumable mechanical energy into electrical energy, unlike existing eco-friendly energy sources such as solar cells and wind power generation.

Conventional self-generating pressure-sensitive light-emitting devices utilize a piezoelectric device and a triboelectric self-generating device to electrically convert energy applied by mechanical stimulation. By connecting two electrodes of these devices in parallel to a light-emitting diode or an electrochemical luminescence and color change material, the presence or absence of mechanical stimulation was distinguished through visual feedback.

Conventionally, to manufacture a self-generating pressure-sensitive light-emitting device, a tactile interface capable of detecting the position of mechanical stimulation was implemented by respectively patterning a piezoelectric device, a triboelectric self-generating device and a light emitting device.

That is, since an existing self-generating pressure-sensitive light-emitting device patterns all of a piezoelectric device, a triboelectric self-generating device and a light emitting device and connects them in parallel, signal interference occurs depending on pattern size and spacing, it is difficult to control the magnitude of an output voltage depending on the magnitude of pressure, and an output duration is very short, so there is a limitation in that it is only possible to distinguish between the presence and absence of pressure.

Korean Patent No. 10-1825079, which is a related technology, uses a mechanoluminescence mechanism that generates light by inducing charge transfer and recombination of luminescent materials by mechanical external forces such as stress, friction, or impact, and can improve the aesthetic effect by changing the intensity of light emission proportionally according to the intensity of vibration.

In addition, Hirai, Yuichi, et al. ("Lifetimes of Lanthanide (III) Triboluminescence Excited by Aerodynamic Shock Waves" The Journal of Physical Chemistry C 123.44 (2019): 27251-27256) discloses a configuration for implementing light emission by inducing the transition of valence band electrons of a light-emitting material using mechanical energy, but there is a limitation that the lifespan is very short.

DISCLOSURE

Technical Problem

Therefore, the present invention has been made in view of the above problems, and it is one object of the present invention to provide a self-generating pressure-sensitive light-emitting device including an electrochemical light-emitting device and a triboelectric self-generating device; and a method of manufacturing the self-generating pressure-sensitive light-emitting device, wherein the electrochemical light-emitting device and the triboelectric self-generating device are provided in a single device and share an electrode and a capacitor layer. Accordingly, a pressure-sensitive signal (alternating current voltage) whose output duration is adjusted can be directly transmitted to the electrochemical light-emitting device so that a luminous signal corresponding to the magnitude and location of the applied pressure can be recognized in real-time without a separate signal conversion process.

Technical Solution

In accordance with an aspect of the present invention, the above and other objects can be accomplished by the provision of a self-generating pressure-sensitive light-emitting device, including: an electrochemical light-emitting device in which a first electrode, a light-emitting layer and a second electrode are sequentially formed; and a triboelectric self-generating device formed on the second electrode and configured to share the second electrode of the electrochemical light-emitting device, wherein the electrochemical light-emitting device and the triboelectric self-generating device share the second electrode and thus the electrochemical light-emitting device is driven due to a potential difference generated from the triboelectric self-generating device.

Power generated from the triboelectric self-generating device depending upon external force may be transmitted to the electrochemical light-emitting device.

A luminous intensity of the electrochemical light-emitting device may be adjusted depending upon a potential difference generated from the triboelectric self-generating device.

The light-emitting layer may include a first solid electrolyte, wherein the first solid electrolyte includes a transition metal complex, a first ionic liquid and a first elastomer.

A concentration of the first ionic liquid may be 70 wt % to 85 wt % based on a total content of the first ionic liquid and first elastomer.

The triboelectric self-generating device may include: the second electrode; a positively charged layer formed on a first region of the second electrode; a negatively charged layer formed on the positively charged layer; and a third electrode formed on the negatively charged layer.

The triboelectric self-generating device may include a second solid electrolyte, wherein the second solid electrolyte includes a second ionic liquid and a second elastomer.

A concentration of the second ionic liquid may be 5 wt % to 15 wt % based on a total content of the second ionic liquid and the second elastomer.

The self-generating pressure-sensitive light-emitting device may further include a charge trapping layer formed between the second electrode and the positively charged layer.

The charge trapping layer may include at least of reduced graphene oxide (rGO), graphene oxide (GO), aromatic polystyrene and aromatic polyimide.

The self-generating pressure-sensitive light-emitting device may further includes a capacitor formed on the second electrode, wherein the capacitor includes: the second electrode; a capacitor layer formed on a second region of the second electrode; and the third electrode formed on the capacitor layer; wherein the capacitor shares the third electrode of the triboelectric self-generating device while sharing the second electrode of the electrochemical light-emitting device.

The triboelectric self-generating device may be formed on a first region of the second electrode, and the capacitor may be formed on a second region of the second electrode.

The capacitor layer may further include a third solid electrolyte, and the third solid electrolyte may include a third ionic liquid and a third elastomer.

A concentration of the third ionic liquid may be 40 wt % to 80 wt % based on a total content of the third ionic liquid and the third elastomer.

In accordance with another aspect of the present invention, there is provided a method of manufacturing a self-generating pressure-sensitive light-emitting device, the method including: forming a first electrode on a substrate; forming a light-emitting layer on the first electrode; forming a second electrode on the light-emitting layer; forming a positively charged layer on a first region of the second electrode; forming a negatively charged layer on the positively charged layer; forming a capacitor layer on a second region on the second electrode; and forming a third electrode on the negatively charged layer and the capacitor layer.

The forming of the positively charged layer may further include forming a charge trapping layer on the second electrode.

Advantageous Effects

According to an embodiment of the present invention, provided are a self-generating pressure-sensitive light-emitting device including an electrochemical light-emitting device and a triboelectric self-generating device; and a method of manufacturing the self-generating pressure-sensitive light-emitting device, wherein the electrochemical light-emitting device and the triboelectric self-generating device are provided in a single device and share an electrode and a capacitor layer. Accordingly, a pressure-sensitive signal (alternating current voltage) whose output duration is adjusted can be directly transmitted to the electrochemical light-emitting device so that a luminous signal corresponding to the magnitude and location of the applied pressure can be recognized in real-time without a separate signal conversion process.

According to an embodiment of the present invention, provided are a self-generating pressure-sensitive light-emitting device and a method of manufacturing the same, wherein a charge trapping layer is included in the triboelectric self-generating device of the self-generating pressure-sensitive light-emitting device. Accordingly, an output duration can be adjusted.

According to an embodiment of the present invention, provided are a self-generating pressure-sensitive light-emitting device and a method of manufacturing the same, wherein a capacitor with a high capacitance is included in the self-generating pressure-sensitive light-emitting device. Accordingly, the luminous efficiency of the electrochemical light-emitting device can be increased.

BEST MODE

Figure 1A:
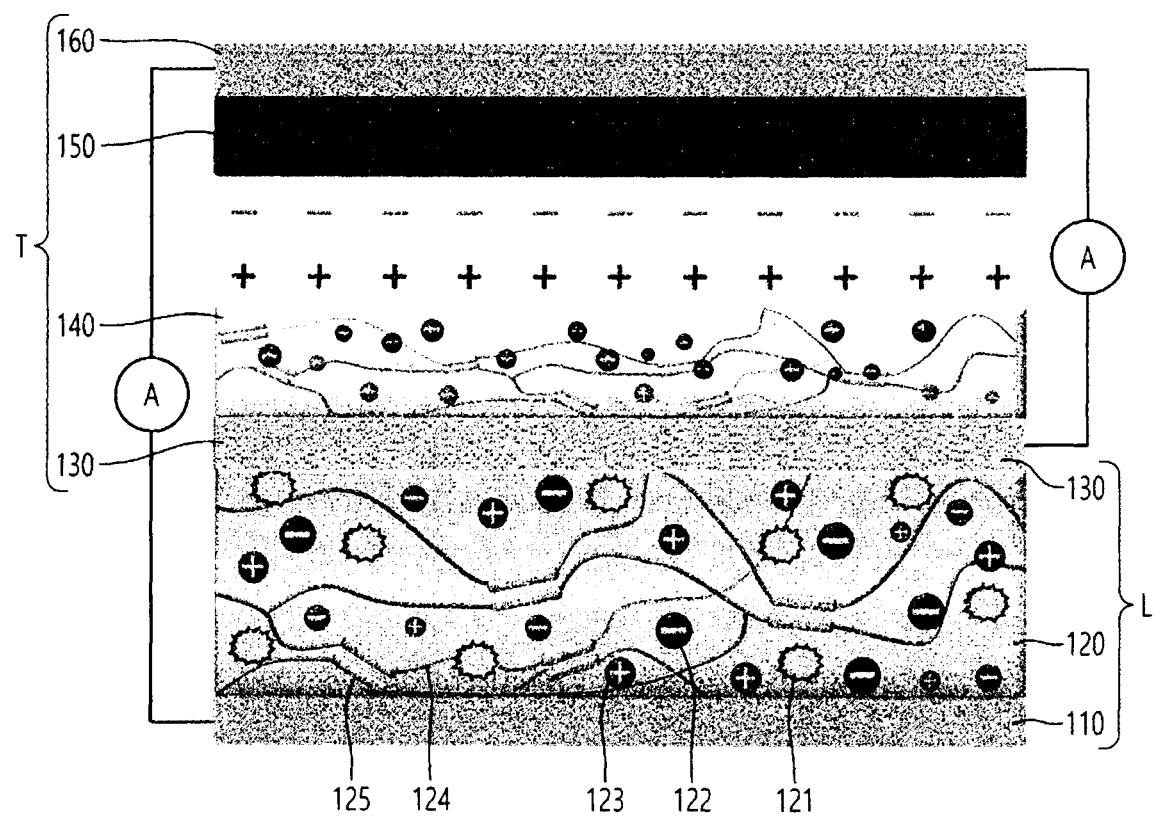
FIG. 1A illustrates a sectional view of a self-generating pressure-sensitive light-emitting device according to an embodiment of the present invention.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 1B:
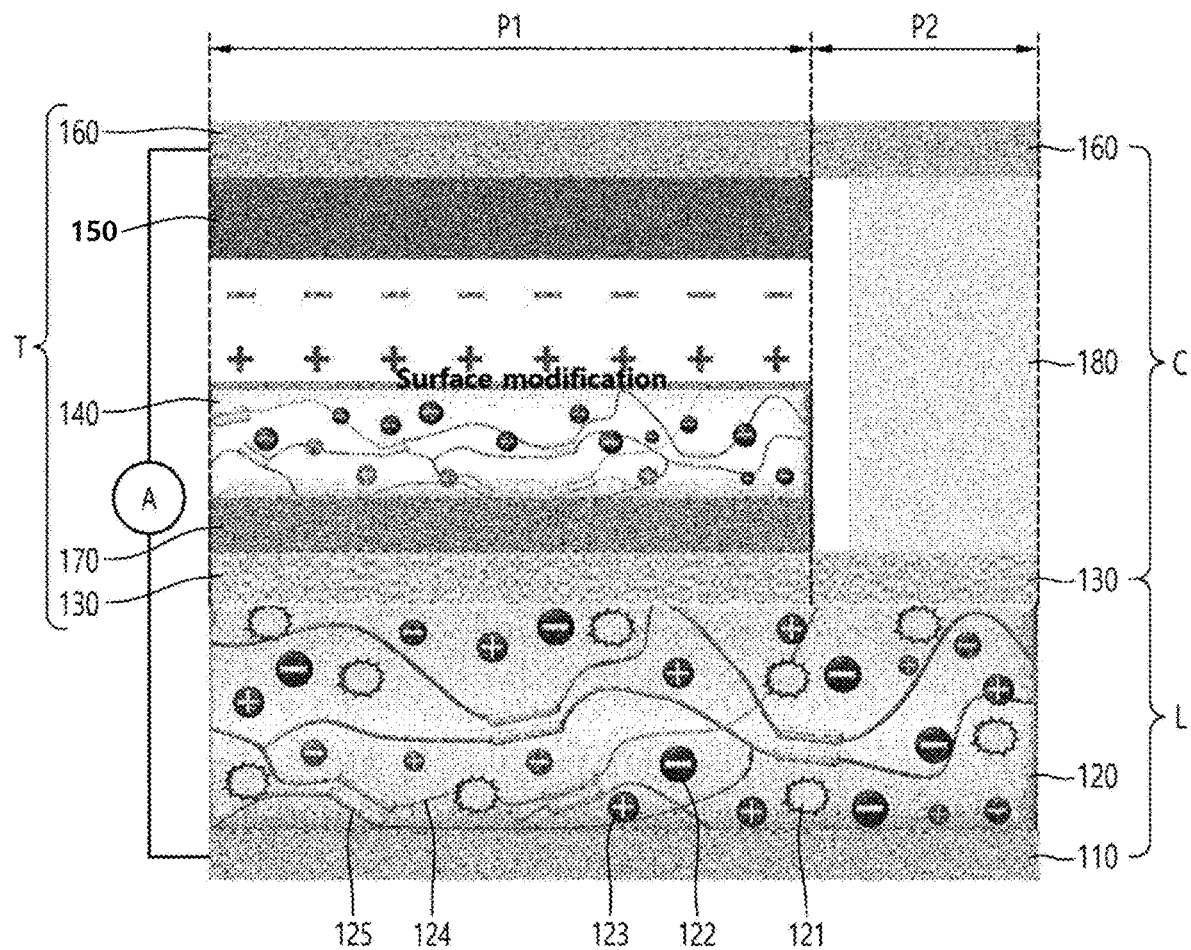
FIG. 1B illustrates a sectional view of a self-generating pressure-sensitive light-emitting device according to an embodiment of the present invention including a charge trapping layer (surface modification) and a capacitor.

FIG. 1A illustrates a sectional view of a self-generating pressure-sensitive light-emitting device according to an embodiment of the present invention, and FIG. 1B illustrates a sectional view of a self-generating pressure-sensitive light-emitting device according to an embodiment of the present invention including a charge trapping layer (surface modification) and a capacitor.

The self-generating pressure-sensitive light-emitting device according to an embodiment of the present invention may produce power using the electrostatic phenomenon of the triboelectric self-generating device T, and may use the produced power as an energy source of an electrochemical light-emitting device L.

The self-generating pressure-sensitive light-emitting device according to an embodiment of the present invention includes an electrochemical light-emitting device L in which a first electrode 110, a light-emitting layer 120 and a second electrode 130 are sequentially formed; and a triboelectric self-generating device T formed on the second electrode 130 and configured to share the second electrode 130 of the electrochemical light-emitting device.

Accordingly, the electrochemical light-emitting device L of the self-generating pressure-sensitive light-emitting device according to an embodiment of the present invention is driven by a potential difference T, generated in the triboelectric self-generating device, due to the second electrode 130 shared by the electrochemical light-emitting device L and the triboelectric self-generating device T.

That is, the self-generating pressure-sensitive light-emitting device according to an embodiment of the present invention is a visual feedback pressure sensor and tactile interface that can convert external force (e.g., pressure) into the intensity of light emission without external power supply, and may be introduced in various forms into tactile interfaces that have been difficult to apply due to battery capacity limitations of small electronic devices and wearable devices.

Accordingly, the self-generating pressure-sensitive light-emitting device according to an embodiment of the present invention may continuously monitor the pulse and respiratory status of chronic disease patients 24 hours a day without battery replacement and may be applied to healthcare devices that can visually provide user's biometric information.

First, the self-generating pressure-sensitive light-emitting device according to an embodiment of the present invention includes the electrochemical light-emitting device L in which the first electrode 110, the light-emitting layer 120 and the second electrode 130 are sequentially formed.

The first electrode 110 is a conductive material and may serve to apply voltage to the light-emitting layer 120. In addition, the first electrode 110 may be electrically connected to the third electrode 180, and the first electrode 110 and the third electrode 160 are connected to each other through a wire so that current flows through the wire.

The first electrode 110 may include at least one of aluminum (Al), copper (Cu), magnesium (Mg), tungsten (W), iron (Fe), platinum (Pt), gold (Au), silver (Ag), tantalum (Ta), titanium (Ti), palladium (Pd), ruthenium (Ru), Indium Tin Oxide (ITO), Indium Zinc Oxide (IZO), Aluminum Zinc Oxide (AZO), Fluorine Tin Oxide (FTO), Carbon Nano Tube (CNT), and graphene.

In addition, the first electrode 110 has stretchability and elasticity, and may be formed by a method such as embedding or buckling, without being limited thereto.

The light-emitting layer 120 is a layer that emits light on its own by receiving current according to a potential difference from the triboelectric self-generating device T, and may have physical and mechanical properties at the same time as direct light emission. the light-emitting layer 120 may receive output voltage generated by the contact and separation of a positively charged layer 140 and negatively charged layer 150 of the triboelectric self-generating device T, may generate oxidation/reduction species of a transition metal complex 121 and may activate recombination to emit light.

Here, since the intensity of light emission of the light-emitting layer 120 is proportional to an applied output voltage and the amount of charge injected, the intensity of light emission may be adjusted according to the magnitude of pressure applied to the first electrode 110 or the third electrode 130.

The light-emitting layer 120 may include the transition metal complex 121 and first ionic liquids 122 and 123.

Preferably, the light-emitting layer 120 may be a first solid electrolyte including the transition metal complex 121 used as a light-emitting material, the first ionic liquids 122 and 123 used as an ionic material and first elastomers 124 and 125 used as a polymer matrix.

The transition metal complex 121 may be an ionic or neutral transition metal complex, and the transition metal complex 121 may include ruthenium (Ru) or iridium (Ir). More particularly, the transition metal complex 121 may include one of tris(2,2'-bipyridine)ruthenium(II) hexafluorophosphate [Ru(bpy)$_3$(PF$_6$)$_2$], tris(4,7-diphenyl-1,10-phenanthroline)ruthenium(II) bis(hexafluorophosphate) [Ru(dp-phen)$_3$(PF$_6$)$_2$], bis(2-phenylpyridine)(2,2'-dipyridine)-iridium(III) hexafluorophosphate [Ir(ppy)$_2$(bpy)PF$_6$], bis(2-phenylpyridine)(4,4'-di-tert-butyl-2,2'-dipyridyl)-iridium (III) hexafluorophosphate [Ir(dtbbpy)(ppy)$_2$PF$_6$], 4,4'-di-tert-butyl-2,2'-dipyridyl-bis [2-(2',4'-difluorophenyl)pyridine]-iridium(III) hexafluorophosphate [Ir(ppy-F2)$_2$(dtb-bpy)PF$_6$] and Ru(bpy)$_3$(TFSI)$_2$ (Tris(bipyridine) ruthenium(II) bis(trifluoromethylsulfonyl)imide). Preferably, the transition metal complex 121 may be Ru(bpy)$_3$(PF$_6$)$_2$ including [Ru(bpy)$_3$]$^{2+}$·2[PF$_6$]$^-$ or Ru(bpy)$_3$(TFSI)$_2$ including [Ru(bpy)$_3$]$^{2+}$·2[TFS]$^-$.

The first ionic liquids 122 and 123 are salts that exist in a liquid state at room temperature and the materials themselves are composed only of ions, so they have a high conductivity of about 10 mS/cm, a wide electrochemical window of 4 V or more, and very low volatility. The viscosity of the first ionic liquids 122 and 123 is similar to water.

The first ionic liquids 122 and 123 may include cations (EMIM+, 123) and anions (TFSI-, 122) as in Formula 1 below:

[Formula 1]

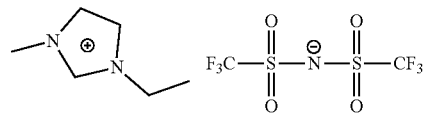

The concentration of the first ionic liquids 122 and 123 may be 70 wt % to 85 wt % compared to a total content of the first ionic liquids 122 and 123 and the first elastomers 124 and 125. When the concentration of the first ionic liquids 122 and 123 is less than 70 wt %, the concentration of ions accumulated at an interface between the electrode (at least one of the first electrode 110 and the second electrode 130) and a solid electrolyte decreases, so it is difficult to make the Schottky barrier sufficiently thin, making effective charge transfer difficult. When the concentration of the first ionic liquids 122 and 123 exceeds 85 wt %, there is a problem that a solid electrolyte form cannot be maintained.

The first elastomers 124 and 125 may be made of thermoplastic polyurethane (TPU). Thermoplastic polyurethane (TPU) is transparent, has elasticity and is well blended with the first ionic liquids 122 and 123.

Thermoplastic polyurethane may be a segmented block copolymer composed of a hard segment 125 with a rigid molecular structure and a soft segment 124 with a flexible molecular structure. Here, a ratio of the hard segment 125 to the soft segment 124 may be variously controlled.

Since the hard segment 125 has a glass transition temperature (Tg) higher than room temperature, physical cross-linking occurs due to crystal formation, hydrogen bonding, or van der Waals forces between the hard segments 125 that exhibit glassy properties.

On the other hand, the soft segment 124 has a glass transition temperature lower than room temperature, so it imparts important properties, such as a high stretching ratio, a high elastic modulus, and a high elastic recovery rate, which an elastic material showing rubbery properties should exhibit. When these segments are subjected to an external force, not only the segment's orientation but also its structure can be changed.

Accordingly, the self-generating pressure-sensitive light-emitting device according to an embodiment of the present invention may have stretchability and flexibility.

The second electrode 130 is a conductive material and serves to apply output voltage generated from a triboelectric self-generating device to the light-emitting layer 120. In addition, the second electrode 130 may be used not only in the electrochemical light-emitting device L, but also in the triboelectric self-generating device T. According to an embodiment, the second electrode 130 may also be used in a capacitor C.

The second electrode 130 may include at least one of aluminum (Al), copper (Cu), magnesium (Mg), tungsten (W), iron (Fe), platinum (Pt), gold (Au), silver (Ag), tantalum (Ta), titanium (Ti), palladium (Pd), ruthenium (Ru), Indium Tin Oxide (ITO), Indium Zinc Oxide (IZO), Aluminum Zinc Oxide (AZO), Fluorine Tin Oxide (FTO), Carbon Nano Tube (CNT), and graphene.

Since the second electrode 130 should transmit light generated from the light-emitting layer 120, a transparent electrode may be preferable. More preferably, Indium Tin Oxide (ITO) may be used as the second electrode 130.

In addition, the second electrode 130 has stretchability and elasticity, and may be formed by a method such as embedding or buckling, without being limited thereto.

The electrochemical light-emitting device L is based on a luminescence mechanism caused by electron exchange between oxidized and reduced species which is generated when charges (electrons and holes) injected from the first electrode 110 and the second electrode 130 activate the oxidation/reduction reaction of the light-emitting layer 120 based on a transition metal complex. Accordingly, the electrochemical light-emitting device L may adjust luminous intensity depending upon an applied potential difference.

That is, the self-generating pressure-sensitive light-emitting device according to an embodiment of the present invention forms the triboelectric self-generating device T and electrochemical light-emitting device C including a solid electrolyte to share the second electrode 130 in a single device, so the electrochemical light-emitting device L may be driven by a potential difference generated in the triboelectric self-generating device T.

The luminous mechanism of the electrochemical light-emitting device L will be described in more detail with reference to FIGS. 2 and 3.

The self-generating pressure-sensitive light-emitting device according to an embodiment of the present invention includes the triboelectric self-generating device T that is formed on the second electrode 130 and shares the second electrode 130 of the electrochemical light-emitting device L.

The triboelectric self-generating device T may include the second electrode 130, the positively charged layer 140 formed on the second electrode 130, the negatively charged layer 150 formed on the positively charged layer 140, and the third electrode 160 formed on the negatively charged layer 150.

The positively charged layer 140 may include a second solid electrolyte. The second solid electrolyte may include a second ionic liquid and a second elastomer.

The second ionic liquid and the second elastomer may include the same properties as the first ionic liquids and the first elastomers.

The triboelectric self-generating device T using the second solid electrolyte is a device for harvesting energy using the electrostatic phenomenon, and may produce electrical energy using the phenomenon in which a positively charged material and a negatively charged material are charged due to the electrostatic phenomenon.

To adjust the ionic conductivity of the triboelectric self-generating device T, the second ionic liquid may be used at a low concentration. The concentration of the second ionic liquid may be 5 wt % to 15 wt % based on a total content of the second ionic liquid and the second elastomer. When the concentration of the second ionic liquid is less than 5 wt %, ions (charges) may be not transmitted in the second solid electrolyte. When the concentration of the second ionic liquid is greater than 15 wt %, ionic conductivity in the second solid electrolyte increases, so charge is not retained in the electrode (at least one of the second electrode 130 and the third electrode 160), resulting in output reduction.

The positively charged layer 140 is a charged material based on a solid electrolyte, an electric double layer can be formed by a potential difference that occurs when in contact (e.g., friction) with the negatively charged layer 150, and ion diffusion and ion concentration gradient within the positively charged layer may be induced depending on the magnitude of the pressure.

Accordingly, since the self-generating pressure-sensitive light-emitting device according to an embodiment of the present invention includes the positively charged layer 140 including the second solid electrolyte, the electrochemical light-emitting device L may be driven by a potential difference occurring in the triboelectric self-generating device T by forming the triboelectric self-generating device T and the electrochemical light-emitting device C to share the second electrode 130 in a single device.

In addition, the magnitude of the triboelectricity output voltage of the triboelectric self-generating device T may be adjusted due to a capacitance that changes depending upon the magnitude of external force (e.g., pressure). Accordingly, the magnitude of the output voltage of the self-generating pressure-sensitive light-emitting device according to an embodiment of the present invention may be controlled depending upon applied external force, and the luminous intensity may be controlled by a potential difference and charge amount induced through this.

For example, the self-generating pressure-sensitive light-emitting device according to an embodiment of the present invention may have a pressure magnitude-dependent output voltage of 100 V to 500 V in a pressure range of 0 kPa to 100 kPa.

According to an embodiment, when the self-generating pressure-sensitive light-emitting device according to an embodiment of the present invention does not include the internal capacitor C (a system in which the triboelectric self-generating device T only exists), an output voltage of 100 V to 500 V occurs. This output voltage range induces 1) the reduction of output voltage and 2) the increase of output duration as a capacitor layer 180 is induced, so the system is not a system for applying directly voltage to the electrochemical light-emitting device L. Accordingly, pressure magnitude-dependent output voltage is not specifically limited.

Preferably, when the capacitor layer 180 is included in the self-generating pressure-sensitive light-emitting device according to an embodiment of the present invention, the pressure magnitude-dependent output voltage may be 3 V to 10 V. When the output voltage is less than 3 V, sufficient charge is not injected into the transition metal complex 121 contained in the electrochemical light-emitting device to generate oxidation/reduction species. When the output voltage is greater than 10 V, too much charge is injected to the oxidation/reduction species of the transition metal complex 121 and the first ionic liquids 122 and 123, so that there is a problem in that the transition metal complex 121 and the first ionic liquids 122 and 123 are not stably maintained.

As the self-generating pressure-sensitive light-emitting device according to an embodiment of the present invention includes the capacitor C, an output duration may be increased while reducing output voltage.

More particularly, there is an advantage in that the luminescence intensity increases when the output voltage is increased, but since the output duration is short and the reaction time required for electrochemical luminescence is not sufficient, there is a problem in that luminescence itself is not achieved. Accordingly, the luminescence characteristics may be adjusted by adjusting the output voltage and the output duration.

The output duration is 20 ms to 100 ms, and when the output duration is less than 20 ms, a high-frequency output voltage is applied to the electrochemical light-emitting device L, so the amount of oxidation/reduction species of the transition metal complex 121 generated at one cycle of output voltage is small. Accordingly, there is a problem that the luminescent properties cannot be confirmed. When the output duration is greater than 100 ms, the recombination rate of oxidation/reduction species of the transition metal complex 121 generated due to the output voltage applied to the electrochemical light-emitting device L is higher than the generation rate thereof, so that all of the generated oxidation/reduction species of the transition metal complex 121 are difficult to recombine, resulting in low luminous intensity.

The second elastomer, i.e., thermoplastic polyurethane, is a positively charged material formed of a porous visco-poroelastic material, and when the second ionic liquid is applied to thermoplastic polyurethane, an ionic material is further contained inside thermoplastic polyurethane. Accordingly, the electric capacity inside thermoplastic polyurethane may further increase. This increased electric capacity may vary depending on the amount of surface charge generated through the electrostatic principle.

When external pressure is applied to the inside of the thermoplastic polyurethane, i.e., a porous visco-poroelastic material, in a state in which ions are contained in thermoplastic polyurethane, ions present inside may be split (ion-squeezed) in a direction parallel to the applied external pressure.

In general, the ion squeezing phenomenon in which ions are split in the second solid electrolyte may occur, as the positively charged layer 140, which is the second solid electrolyte, contains a larger amount of charge, thereby improving electrical output. However, when the concentration of the second ionic liquid is too high (e.g., when the concentration of the second ionic liquid is greater than 15% by weight), the ionic conductivity in an electrolyte increases, so the electrode does not retain charges, resulting in output reduction. Accordingly, the concentration of the second ionic liquid should be optimal, and the second elastomer should be mixed in an optimal composition ratio.

According to an embodiment, the triboelectric self-generating device T formed between the second electrode 130 and the positively charged layer 140 may further include a charge trapping layer 170.

For example, the charge trapping layer 170 may be formed as a separate layer on the surface of the positively charged layer 140, or may be inserted inside a film closed to the surface of the positively charged layer 140 closed to the second electrode 130.

The charge trapping layer 170 may confine charges at an interface between the second electrode 130 and the positively charged layer 140 by confining charges due to the chemical structure and electrical properties of the aromatic compound. Accordingly, the charge trapping layer 140 allows the positively charged layer 140 and the negatively charged layer 150 to maintain the relaxation time of polarization and electric double layer formation, which occurs during friction, for a longer period of time due to the ion and electron trap effect, so that the output duration of the self-generating pressure-sensitive light-emitting device T increases. Accordingly, luminous efficiency may be improved because the oxidation/reduction reaction time required for electrochemical luminescence is satisfied.

The negatively charged layer 150 may be formed of a relatively negatively charged material compared to the positively charged layer 140. For example, the negatively charged layer 150 may be formed of polytetrafluoroethylene (PTFE) or Teflon as a material having an electronegativity different from the positively charged layer 140.

The negatively charged layer 150 is spaced apart from the negatively charged layer 150 at a predetermined interval so that it can selectively contact and separate from the positively charged layer 140, and may be formed at the third electrode 160.

The negatively charged layer 150 is brought into contact with and separated from the positively charged layer 140 by an external force applied to the first electrode 110 or the third electrode 130, so that electric double layers (EDLs) are formed in upper and lower layers of the positively charged layer 140 due to the ion squeezing phenomenon, and separation of charges may be formed between the positively charged layer 140 and the negatively charged layer 150 due to the formation of ion layers in the positively charged layer 140.

The third electrode 160 includes at least one of aluminum (Al), copper (Cu), magnesium (Mg), tungsten (W), iron (Fe), platinum (Pt), gold (Au), silver (Ag), tantalum (Ta), titanium (Ti), palladium (Pd), ruthenium (Ru), Indium Tin Oxide (ITO), Indium Zinc Oxide (IZO), Aluminum Zinc Oxide (AZO), Fluorine Tin Oxide (FTO), Carbon Nano Tube (CNT), and graphene.

Preferably, Since the third electrode 160 should transmit light generated from the light-emitting layer 120, a transparent electrode can be used. More preferably, Indium Tin Oxide (ITO) may be used for the third electrode 160.

In addition, since the third electrode 160 has stretchability and elasticity, it may be formed by a method such as, for example, embedding or buckling, without being limited thereto.

The positively charged layer 140 may be formed on the second electrode 130 of the triboelectric self-generating device T, the negatively charged layer 150 may be formed on the third electrode 160, the positively charged layer 140 and the negatively charged layer 150 may be spaced apart from each other, and the positively charged layer 140 and the negatively charged layer 150 may selectively contact each other due to external force.

Accordingly, when the positively charged layer 140 and the negatively charged layer 150 contact or are separated from each other due to external force and the positively charged layer 140 and the negatively charged layer 150 contact or are separated from each other, electrical energy may be generated between the second electrode 130 and the third electrode 160. That is, when the positively charged layer 140 and the negatively charged layer 150 contact or are separated from each other, current may flow in a wire for connecting the second electrode 130 and the third electrode 160. This current is transmitted to the first electrode 110 and second electrode 130 of the electrochemical light-emitting device L, so that the electrochemical light-emitting device L is driven.

According to an embodiment, the self-generating pressure-sensitive light-emitting device according to an embodiment of the present invention may further include the capacitor C formed on the second electrode.

FIG. 1A illustrates a self-generating pressure-sensitive light-emitting device according to an embodiment of the present invention not including the charge trapping layer 170 and the capacitor C, and FIG. 1B illustrates a self-generating pressure-sensitive light-emitting device according to an embodiment of the present invention including the charge trapping layer 170 and the capacitor C. Here, the charge trapping layer 170 and the capacitor C are optional.

When the self-generating pressure-sensitive light-emitting device according to an embodiment of the present invention includes the capacitor C, the triboelectric self-generating device T may be formed on a first region of the second electrode 130, the capacitor C may be formed on a second region of the second electrode 130, all of the electrochemical light-emitting device L, the triboelectric self-generating device T and the capacitor C may share the second electrode 130, and the triboelectric self-generating device T and the capacitor C may share the third electrode 160.

Accordingly, a first region P1 of the second electrode 130 refers to the triboelectric self-generating device T capable of outputting voltage by external mechanical stimulation, and a second region P2 refers to the capacitor C serving to increase an output duration.

In the self-generating pressure-sensitive light-emitting device according to an embodiment of the present invention, there is no issue in driving the device even if the second region P2 is formed to be relatively larger than the first region P1. Accordingly, the areas of the first region P1 and the second region P2 are not particularly limited, and the areas of the first region P1 and the second region P2 may be adjusted depending upon the purpose.

The capacitor C may include the second electrode 130, the capacitor layer 180 formed on the second region P2 of the second electrode 130 and the third electrode 160 formed on the capacitor layer 180.

The capacitor C may share the third electrode 160 of the triboelectric self-generating device L while sharing the second electrode 130 of the electrochemical light-emitting device L to increase the output duration by storing charged charges during friction.

In addition, the capacitor C should be made of a transparent and flexible material because it should transmit light generated from the electrochemical light-emitting device L.

Accordingly, the capacitor layer 180 may include a third solid electrolyte, and the third solid electrolyte may include a third ionic liquid and a third elastomer.

The third ionic liquid and the third elastomer may include the same properties as the first ionic liquids and the first elastomers.

To increase the capacitance, the capacitor C may include the third ionic liquid at a high concentration. To adjust the capacitance, the concentration of the third ionic liquid may be 40 wt % to 80 wt % based on a total content of the third ionic liquid and the third elastomer. When the concentration of the third ionic liquid is less than 40 wt %, the ionic conductivity is too low, so there is a problem in that it takes a relatively long time to charge the charge in the capacitor C. When the concentration of the third ionic liquid is greater than 80 wt %, there is a problem in that the shape of a solid electrolyte cannot be maintained.

When the self-generating pressure-sensitive light-emitting device according to an embodiment of the present invention includes the charge trapping layer 170 and the capacitor 180, the luminous efficiency may be improved by adjusting the output duration of output voltage.

For example, since a self-generating device has an output duration of ~ tens of ms, it is not sufficient to induce the oxidation/reduction reaction that is the principle of driving electrochemical light emission. However, since the charge trapping layer 170 and the capacitor 180 are included in the self-generating pressure-sensitive light-emitting device according to an embodiment of the present invention, the charge retention time of the second electrode 130 increases, resulting in increase of an output duration. Accordingly, luminous efficiency may be improved because sufficient time is secured to induce oxidation/reduction reaction.

The output duration is 20 ms to 100 ms, and when the output duration is less than 20 ms, a high-frequency output voltage is applied to the electrochemical light-emitting device L, so that the amount of the oxidation/reduction species of the transition metal complex 121 generated at one cycle of output voltage is small, resulting in a problem that luminescence characteristics cannot be confirmed. When the output duration is greater than 100 ms, the recombination rate of oxidation/reduction species of the transition metal complex 121 generated by output voltage applied to the electrochemical light-emitting device L is higher than the generation rate thereof, so that there is a problem in exhibiting continuous light emission. In addition, there is a problem in that all of the generated oxidation/reduction species of the transition metal complex 121 are difficult to recombine, resulting in low luminous intensity.

Since the self-generating pressure-sensitive light-emitting device according to an embodiment of the present invention is formed by laminating the electrochemical light-emitting device L, the triboelectric self-generating device T and the capacitor C in the single device, the electrochemical light-emitting device L may be driven through the triboelectric self-generating device T without separate signal conversion processing.

In the self-generating pressure-sensitive light-emitting device according to an embodiment of the present invention, power generated from the triboelectric self-generating device T according to external force is transmitted to the electrochemical light-emitting device C, so luminous intensity may be adjusted according to a potential difference generated from the triboelectric self-generating device T.

Accordingly, the magnitude of external force of the self-generating pressure-sensitive light-emitting device according to an embodiment of the present invention is adjusted depending upon the luminous intensity, so it can be applied to flexible touch panels or buttonless keyboards that require visual feedback due to external force.

The method of manufacturing the self-generating pressure-sensitive light-emitting device according to an embodiment of the present invention includes a step (S110) of forming the first electrode 110 on a substrate, a step (S120) of forming the light-emitting layer 120 on the first electrode 110, a step (S130) of forming the second electrode 130 on the light-emitting layer 120, a step (S140) of forming the positively charged layer 140 on a first region P1 on the second electrode 130, a step (S150) of forming the negatively charged layer 150 on the positively charged layer 140, a step (S160) of forming the capacitor layer 180 in a second region P2 on the second electrode 130 and a step (S170) of forming the third electrode 160 on the negatively charged layer 150 and the capacitor layer 180.

The method of manufacturing the self-generating pressure-sensitive light-emitting device according to an embodiment of the present invention includes the same components in the self-generating pressure-sensitive light-emitting device according to an embodiment of the present invention, so a detailed description thereof is omitted.

First, the step (S110) of forming the first electrode 110 on a substrate of the method of manufacturing the self-generating pressure-sensitive light-emitting device according to an embodiment of the present invention is performed.

The first electrode 110 may be formed by applying a conductive material on a substrate, and then patterning the same. The conductive material may be formed of one method of thermal evaporation, chemical vapor deposition (CVD), plasma enhanced CVD (PECVD), low-pressure CVD (LPCVD), physical vapor deposition (PVD), sputtering, and atomic layer deposition (ALD).

According to an embodiment, the conductive material may be formed by transfer or an electrospinning method such as spray coating or vacuum filtration depending on conditions.

Next, the conductive material may be patterned by photolithography or e-beam lithography to form the first electrode 110.

Next, the step (S120) of forming the light-emitting layer 120 on the first electrode 110 of the method of manufacturing the self-generating pressure-sensitive light-emitting device according to an embodiment of the present invention is performed.

The light-emitting layer 120 may be formed by a molding method using photo-curing or thermal curing, an etching process, spin coating, or the like. For example, in the step (S120) of forming the light-emitting layer 120, a mixed solution may be first prepared by mixing a transition metal compound, first ionic liquids and first elastomers. Next, the mixed solution may be directly formed on the first electrode 110, or a composite film may be formed.

When the mixed solution is directly formed on the first electrode 110, the light-emitting layer 120 may be formed by one method of spin coating, spray coating, ultra spray coating, electrospinning coating, slot die coating, gravure coating, bar coating, roll coating, dip coating, sheer coating, screen printing, inkjet printing and nozzle printing.

When the composite film is formed, the mixed solution may be injected into a mold and cured to generate the light-emitting layer 120, and then the light-emitting layer 120 may be separated from the mold, and then placed on the first electrode 110.

Next, the step (S130) of forming the second electrode 130 on the light-emitting layer 120 of the method of manufacturing the self-generating pressure-sensitive light-emitting device according to an embodiment of the present invention is performed.

The second electrode 130 may be formed in the same manner as in the first electrode 120.

The step (S140) of forming the positively charged layer 140 on a first region P1 on the second electrode 130 of the method of manufacturing the self-generating pressure-sensitive light-emitting device according to an embodiment of the present invention is performed.

The positively charged layer 140 may be formed in the same manner as in the light-emitting layer 120 except that different materials are used.

For example, in the step (S140) of forming the positively charged layer 140, a second ionic liquid and a second elastomer are first mixed to prepare a mixed solution. Next, the mixed solution may be directly formed on the second electrode 130, or a composite film may be formed.

The mixed solution is directly formed on the second electrode 130, and then patterned using photolithography or e-beam lithography, thereby being formed only on the first region P1 of the second electrode 120.

The mixed solution may be formed by one method of spin coating, spray coating, ultra spray coating, electrospinning coating, slot die coating, gravure coating, bar coating, roll coating, dip coating, sheer coating, screen printing, inkjet printing and nozzle printing.

When the composite film is formed, the mixed solution is injected into a mold and cured to generate the positively charged layer 140. Next, the positively charged layer 140 is separated from the mold, and then placed on the first region P1 of the second electrode 120.

According to an embodiment, the step (S140) of forming the positively charged layer 140 may further include a step of forming a charge trapping layer on the second electrode 130.

For example, the charge trapping layer 170 may be formed as a separate layer on the surface of the positively charged layer 140, or may be inserted into a film close to the surface of the positively charged layer 140 close to the second electrode 130.

For example, the charge trapping layer 170 is solidified by forming reduced graphene oxide (rGO) or graphene oxide (GO) on the surface of a temporary substrate using spin coating and spray coating, and then pouring a mixed solution prepared by mixing the second ionic liquid and the second elastomer on the substrate on which the charge trapping layer 170 has been formed, thereby forming the positively charged layer 140.

Next, the positively charged layer 140, in the surface of which the charge trapping layer 170 containing reduced graphene oxide (rGO) or graphene oxide (GO) is inserted, may be formed by separating the positively charged layer 140 (preferably, the charge trapping layer 170/the positively charged layer 140), formed on the temporary substrate, from the temporary substrate.

The charge trapping layer 170 may be formed by one method of spin coating, spray coating, ultra spray coating, electrospinning coating, slot die coating, gravure coating, bar coating, roll coating, dip coating, sheer coating, screen printing, inkjet printing and nozzle printing.

The negatively charged layer 150 may be formed by applying a negatively charged material in one manner of spin coating, spray coating, ultra spray coating, electrospinning coating, slot die coating, gravure coating, bar coating, roll coating, dip coating, sheer coating, screen printing, inkjet printing and nozzle printing.

Next, the negatively charged material is patterned by photolithography or e-beam lithography, thereby being formed only in the first region P1 of the second electrode 130.

Next, the step (S160) of forming the capacitor layer 180 in a second region P2 on the second electrode 130 of the method of manufacturing the self-generating pressure-sensitive light-emitting device according to an embodiment of the present invention is performed.

The capacitor layer 180 may be formed by a molding method using photo-curing or thermal curing, an etching process, spin coating, or the like.

The capacitor layer 180 may be formed in the same manner as in the positively charged layer 140 except that it is formed in the second region P2 and a third ionic liquid and a third elastomer are used.

Finally, the step (S170) of forming the third electrode 160 on the negatively charged layer 150 and the capacitor layer 180 of the method of manufacturing the self-generating pressure-sensitive light-emitting device according to an embodiment of the present invention is performed.

The third electrode 160 may be formed in the same manner as in the first electrode 120.

Figure 2:
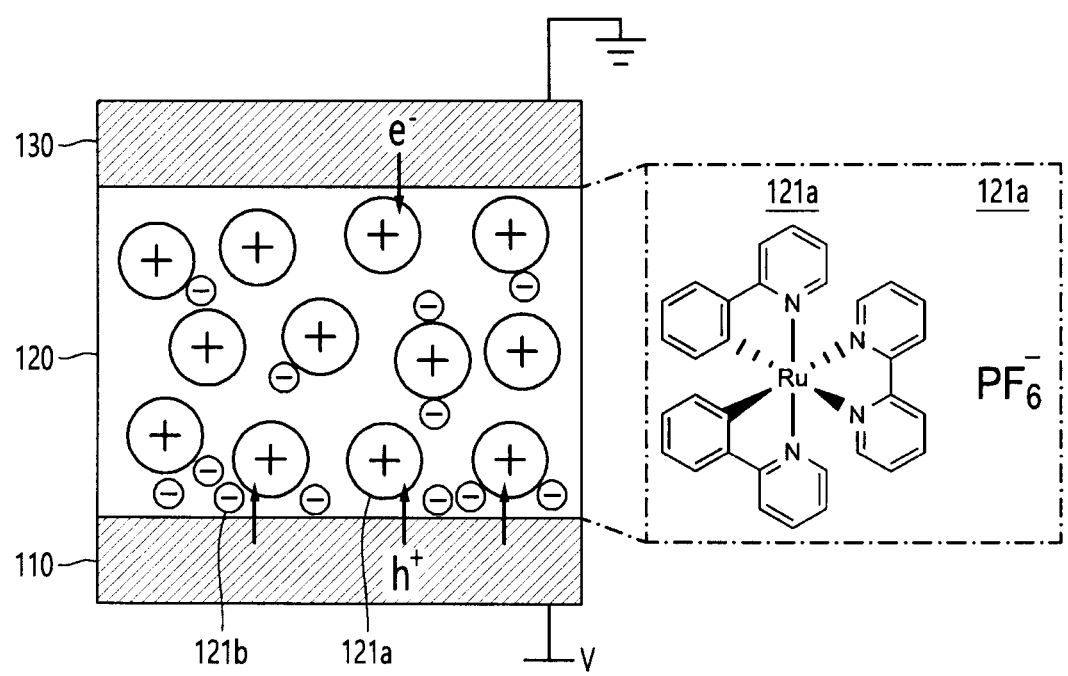
FIG. 2 illustrates a sectional view of an existing electrochemical light emission device.
Figure 3:
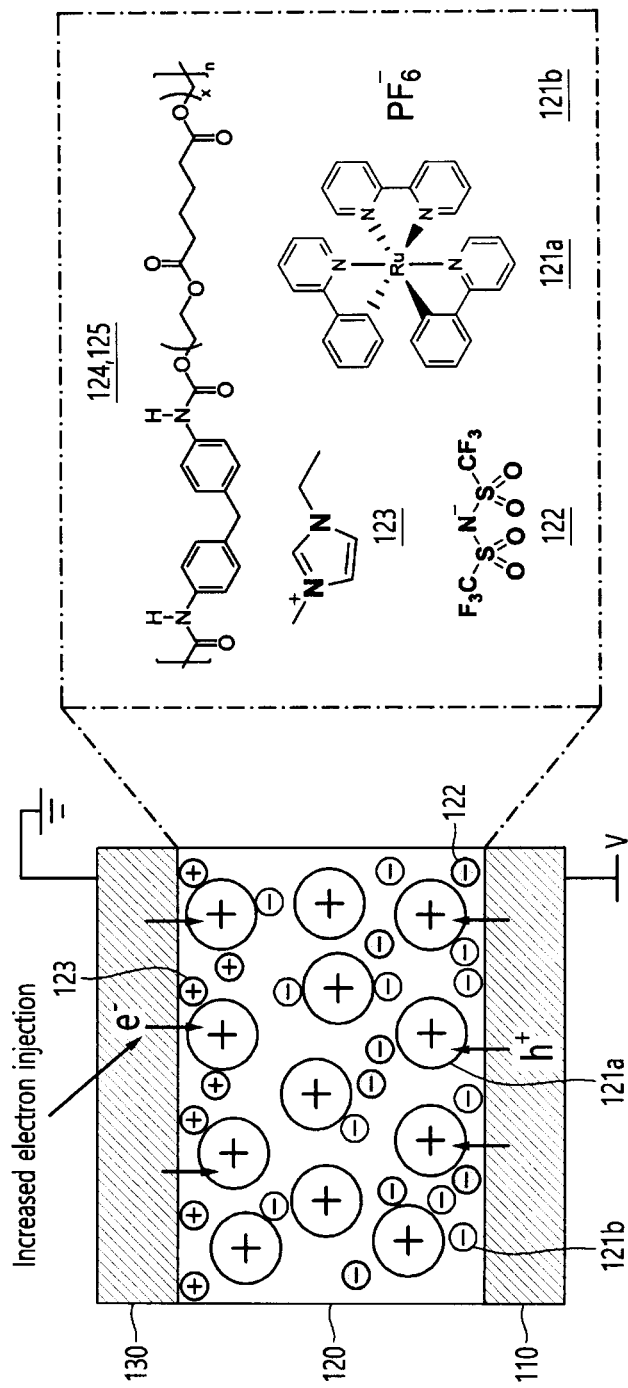
FIG. 3 illustrates a sectional view of an electrochemical light-emitting device included in the self-generating pressure-sensitive light-emitting device according to an embodiment of the present invention.

FIG. 2 illustrates a sectional view of an existing electrochemical light emission device, and FIG. 3 illustrates a sectional view of an electrochemical light-emitting device included in the self-generating pressure-sensitive light-emitting device according to an embodiment of the present invention.

In the case of the existing electrochemical light emission device, cations 121a and anions 121b contained in a transition metal complex of an active layer 230 may move to the periphery of a first electrode 110 and a second electrode 130 when direct current voltage or alternating voltage is applied to the first electrode 110 and the second electrode 130.

However, since the cations 121a included in the transition metal complex 121 receive charge injection from the first electrode 110, high voltage is required due to a high energy barrier, and the cations 121a and the anions 121b are not stably maintained due to the high voltage.

On the other hand, in the case of the electrochemical light-emitting device L used in the self-generating pressure-sensitive light-emitting device according to an embodiment of the present invention, cations 121 and anions 122 included in the first ionic liquids of an active layer 230 may move to the periphery of the first electrode 110 and the second electrode 130 when a potential difference is applied to the first electrode 110 and the second electrode 130.

For example, when the first electrode 110 and the second electrode 130 are applied with output voltage from a triboelectric self-generating device, cations 123 included in the first ionic liquids inside the light-emitting layer 120 move to the second electrode 130, and the anions 122 move to the first electrode 110.

Specifically, around the second electrode 130, electrons are obtained from the electrode, so reduced chemical species increase. Accordingly, the cations 123 including the first ionic liquids move to the second electrode 130 to maintain electrical neutrality. On the other hand, chemical species oxidized by providing electrons to the electrode increase around the first electrode 110, so the anions 122 contained in the first ionic liquids move to the first electrode 110 to maintain electrical neutrality.

For example, when the electrochemical light-emitting device L used in the self-generating pressure-sensitive light-emitting device according to an embodiment of the present invention includes Ru(bpy)$_3$(TFSI)$_2$ as a transition metal complex, the light-emitting layer 120 may include cations (121a), anions (121b) and ruthenium ions (Ru$^{2+}$), and, when output voltage is applied from the triboelectric self-generating device, oxidation reaction or reduction reaction may occur in the first electrode 110 and the second electrode 130.

For example, depending upon the applied voltage when voltage is applied to the first electrode 110 and the second electrode 130, a reduction reaction wherein Ru$^{2+}$ ions present around the second electrode 130 obtain electrons to become Ru$^{1+}$ occurs, and an oxidation reaction wherein Ru$^{2+}$ ions present around the first electrode 110 lost electrons to become Ru$^{3+}$ occurs.

Next, Ru$^{1+}$ ions and Ru$^{2+}$ ions are combined and excited, and then return to a stable state to emit light.

The intensity of light emission of the self-generating pressure-sensitive light-emitting device according to an embodiment of the present invention may increase when pressure is applied from the outside or tension is applied to the light-emitting layer 120.

More particularly, as external pressure or tension is applied, the shape of segments dividing the inside of the light-emitting layer 120 changes and ions isolated inside the segment are released to the outside. Accordingly, more ions exist around the first electrode 110 and the second electrode 130, and the oxidation-reduction reaction rate of Ru$^{2+}$ ions increases, so that the intensity of light emission increases.

Figure 4:
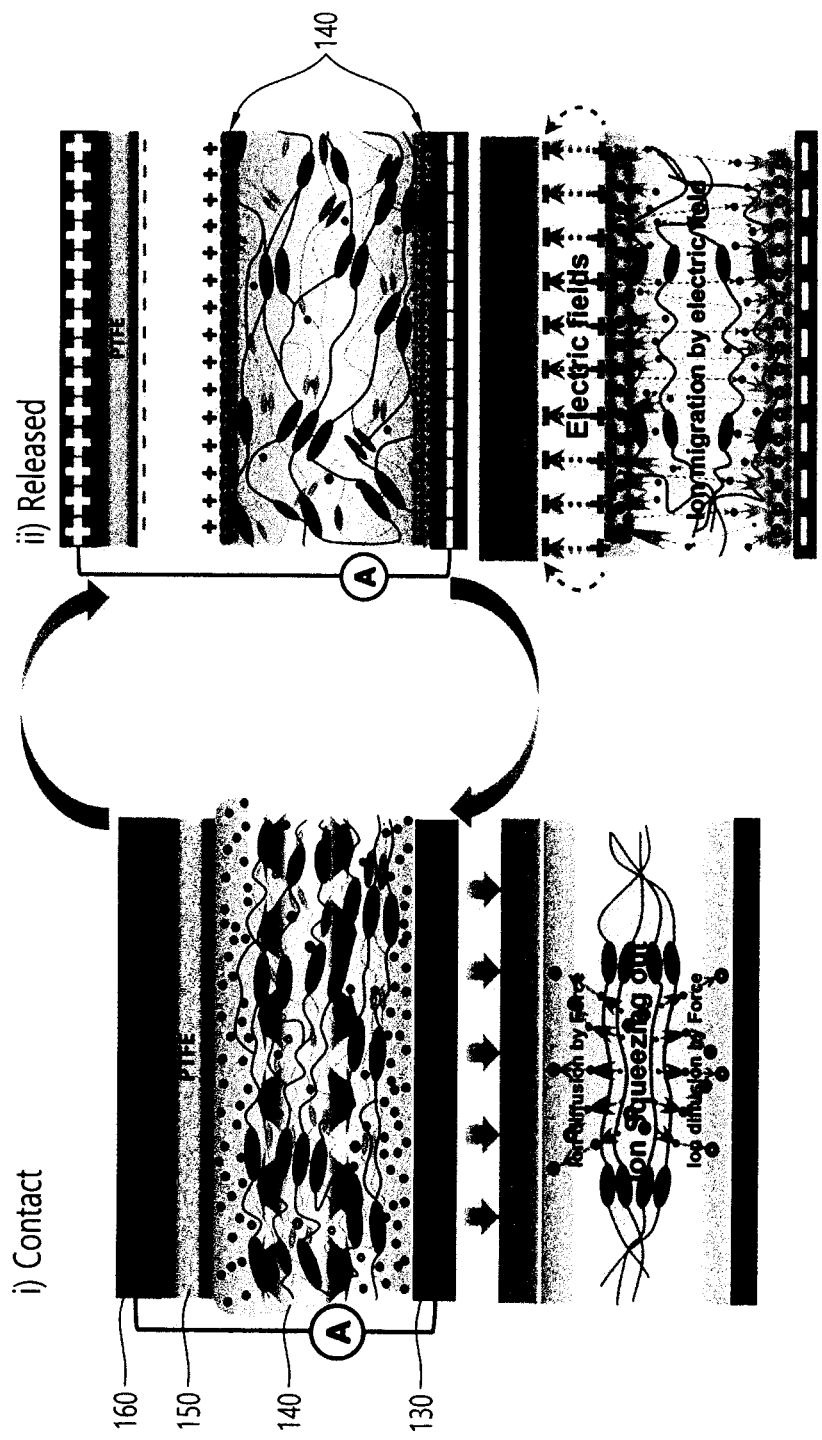
FIG. 4 schematically illustrates the mechanism of a triboelectric self-generating device included in the self-generating pressure-sensitive light-emitting device according to an embodiment of the present invention.

FIG. 4 schematically illustrates the mechanism of a triboelectric self-generating device included in the self-generating pressure-sensitive light-emitting device according to an embodiment of the present invention.

When external force is applied to the self-generating pressure-sensitive light-emitting device according to an embodiment of the present invention, the positively charged layer 140 and the negatively charged layer 150 contact or are separated from each other, and electric double layers (EDLs) may be formed on upper and lower layers inside the positively charged layer 140 due to the ion squeezing phenomenon.

Accordingly, the triboelectric self-generating device enables the movement of ions not only by potential difference but also by external stimulation, enabling improved output. That is, an anion layer is formed in an upper part of the positively charged layer 140, and a cation layer is formed in a lower part of the positively charged layer 140, so that the surface of the positively charged layer 140 may be charged with cations, and the surface of the negatively charged layer 150 may be charged with anions. Here, the ion layers are electric double layers, exist inside the positively charged layer 140 formed of the second solid electrolyte, and relate to a phenomenon in which ions accumulate at the interface due to an external potential difference.

When pressure is applied to the self-generating pressure-sensitive light-emitting device according to an embodiment of the present invention, the positively charged layer 140 comes into contact with the negatively charged layer 150, and separation wherein positive charges present in the positively charged layer 140 move toward the second electrode 120 and negative charges move toward the third electrode 160 occurs. Accordingly, negative charges among ions contained inside the positively charged layer 140 move toward the negatively charged layer 150, and positive charges thereamong move toward the opposite direction, causing ions to be split into both sides.

As two electric layers are generated, the triboelectric self-generating device can form a large amount of charge on the surface, and the output can be improved by the large amount of charge.

[Preparation Example 1-1]: First Solid Electrolyte

Step 1: Preparation of Transition Metal Complex

Aqueous ammonia was added dropwise to bis(trifluoromethane) sulfonimide (HTFSI, Sigma-Aldrich) in a molar ratio of 1:10 at 0° C. or less and stirred for 10 minutes to prepare an aqueous ammonium bis(trifluoromethylsulfonyl)imide) (NH$_4$TFSI) solution. In addition, tris(bipyridine) ruthenium(II) chloride (Ru(bpy)$_3$Cl$_2$, Sigma-Aldrich), as a transition metal complex, was mixed with NH$_4$TFSI in a molar ratio of 1:10 in water and dispersed for 15 minutes using a sonicator to prepare an aqueous Ru(bpy)$_3$Cl$_2$ solution.

The prepared aqueous Ru(bpy)$_3$Cl$_2$ solution was added dropwise while continuously stirring the prepared aqueous NH$_4$TFSI solution at room temperature to synthesize an aqueous Ru(bpy)$_3$TFSI$_2$ (Tris(bipyridine)ruthenium(II) bis(trifluoromethylsulfonyl)imide) ammonia dispersion solution. A transition metal complex was obtained by filtering the synthesized aqueous Ru(bpy)$_3$TFSI$_2$ ammonia dispersion solution under reduced pressure.

Step 2: Preparation of Thermoplastic Polyurethane Solution

Thermoplastic polyurethane (TPU) beads (KA-480, Kolon Industries, Inc.) were added to N,N-dimethyl formamide (DMF, Sigma-Aldrich) in a mass ratio of 1:2, and continuously stirred at 80° C. for 3 hours to prepare a TPU solution.

Step 3: Preparation of First Solid Electrolyte Solution

1-Ethyl-3-MethylIMidazolium bis(TriFluoromethylSulfonyl)Imide ([EMIM]$^+$ [TFSI]$^-$) as an ionic liquid (IL) was added to the TPU beads in a weight ratio of 1:4 while continuously stirring the TPU solution obtained in step 2 at 80° C., followed by additionally stirring for 1 hour. Ru(bpy)$_3$TFSI$_2$ obtained in step 1 and DMF were respectively mixed with the TPU beads in weight ratios of 4:1 and 1:3 to prepare a transition metal complex solution. This solution was added to the TPU solution and additionally stirred for 12 hours.

Step 4: Manufacturing of First Solid Electrolyte Composite Film

The first solid electrolyte solution obtained in step 3 was poured in a predetermined amount into a 40° C. Teflon mold, and heat-treated at 120° C. for 72 hours while elevating the temperature at a rate of 10° C. per hour to prepare a composite film of about 200 pan.

[Preparation Example 1-2]: Second Solid Electrolyte

A second solid electrolyte was prepared in the same manner as in Preparation Example 1-1 except that a transition metal complex was prepared in step 1 of Preparation Example 1-1 and a transition metal complex solution was prepared in step 3 of Preparation Example 1-1.

[Preparation Example 1-3]: Third Solid Electrolyte

A third solid electrolyte was prepared in the same manner as in Preparation Example 1-1 except that a transition metal complex was prepared in step 1 of Preparation Example 1-1, a transition metal complex solution was prepared in step 3 of Preparation Example 1-1, and EMIMTFSI was mixed with TPU beads in a weight ratio of 1:0.6 to 4 in step 3 of Preparation Example 1-1.

Manufacturing Example 2: Self-Generating Pressure-Sensitive Light-Emitting Device The composite film (thickness: 170 μm, area: 0.5 to 1 cm$^2$) obtained in step 4 was placed between glass substrates surface-coated with an Indium Tin Oxide (ITO) electrode, and a silver wire (Nilaco, diameter: 50 μm) was connected to the ITO electrodes to manufacture a pressure sensor.

Figure 5:
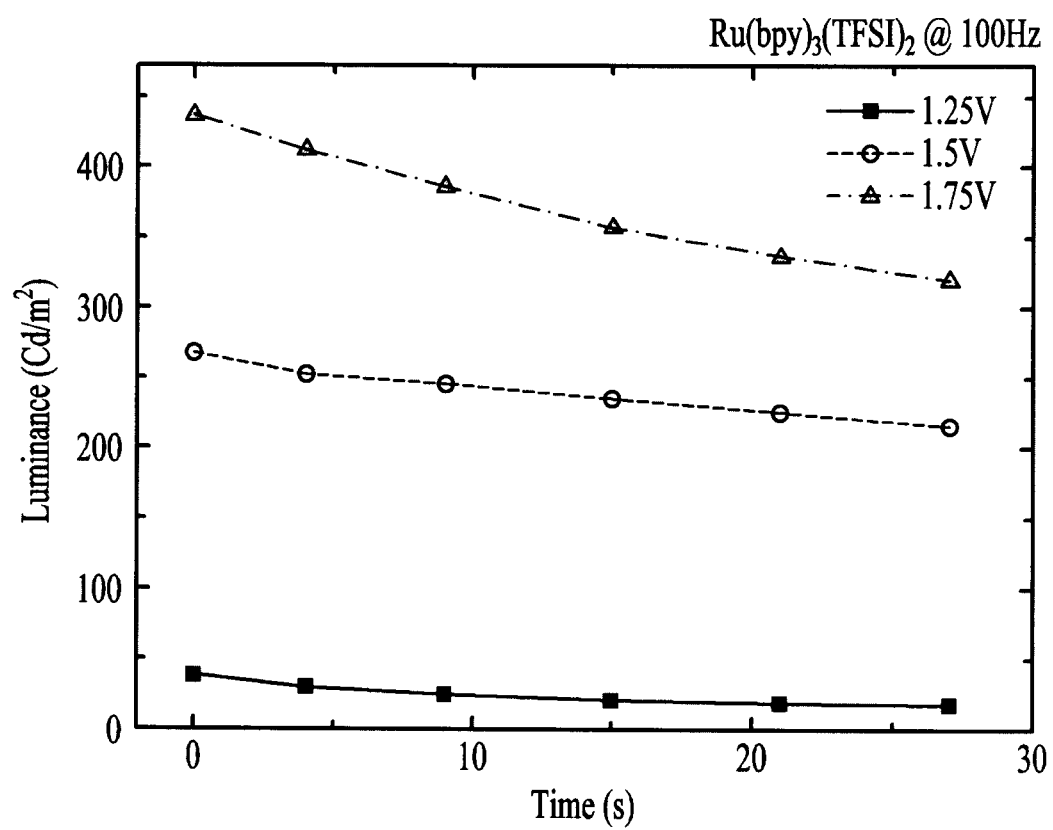
FIG. 5 illustrates the time-dependent luminescence characteristics of the electrochemical light-emitting device included in the self-generating pressure-sensitive light-emitting device according to an embodiment of the present invention.
Figure 6:
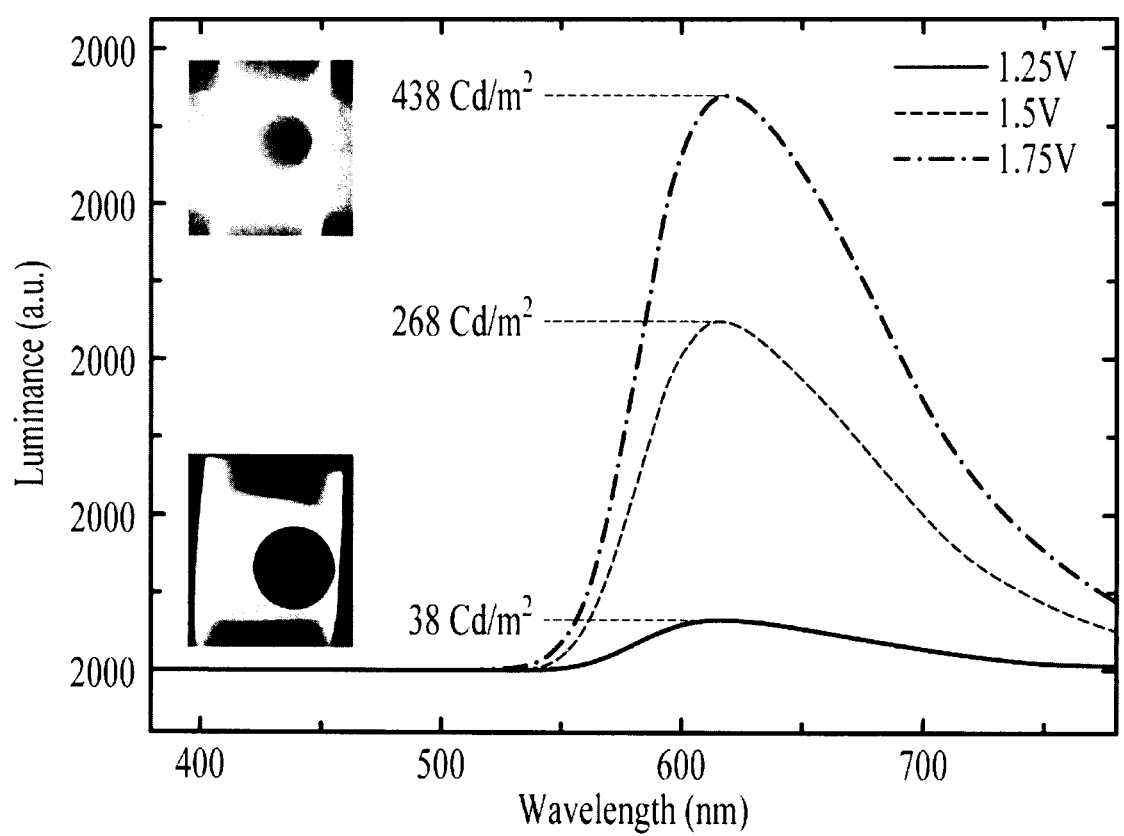
FIG. 6 illustrates wavelength-dependent luminescence characteristics.

FIG. 5 illustrates the time-dependent luminescence characteristics of the electrochemical light-emitting device included in the self-generating pressure-sensitive light-emitting device according to an embodiment of the present invention, and FIG. 6 illustrates wavelength-dependent luminescence characteristics.

Referring to FIGS. 5 to 6, it can be seen that when Ru(bpy)$_3$(TFSI)$_2$ as a transition metal complex is used in the light-emitting layer in the electrochemical light-emitting device included in the self-generating pressure-sensitive light-emitting device according to an embodiment of the present invention, the luminous intensity of the Ru(bpy)$_3$(TFSI)$_2$ solution-type electrochemical light-emitting device based on anion exchange ion species increases by more than about three times compared to the conventionally used Ru(bpy)$_3$(PF$_6$)$_2$, and the difference in light emission dependent upon voltage magnitude and frequency also changes significantly.

In addition, it can be seen that the electrochemical light-emitting device included in the self-generating pressure-sensitive light-emitting device according to an embodiment of the present invention stably maintains light emission at an intensity of 100 cd/m$^2$ for 2 minutes or more.

Meanwhile, in the electrochemical light-emitting device included in the self-generating pressure-sensitive light-emitting device according to an embodiment of the present invention, oxidation/reduction species may exhibit a sharp decrease in emission maintenance time at above 2 V or higher due to issues with the recovery of oxidation/reduction species or stability of the ionic liquid.

Figure 7:
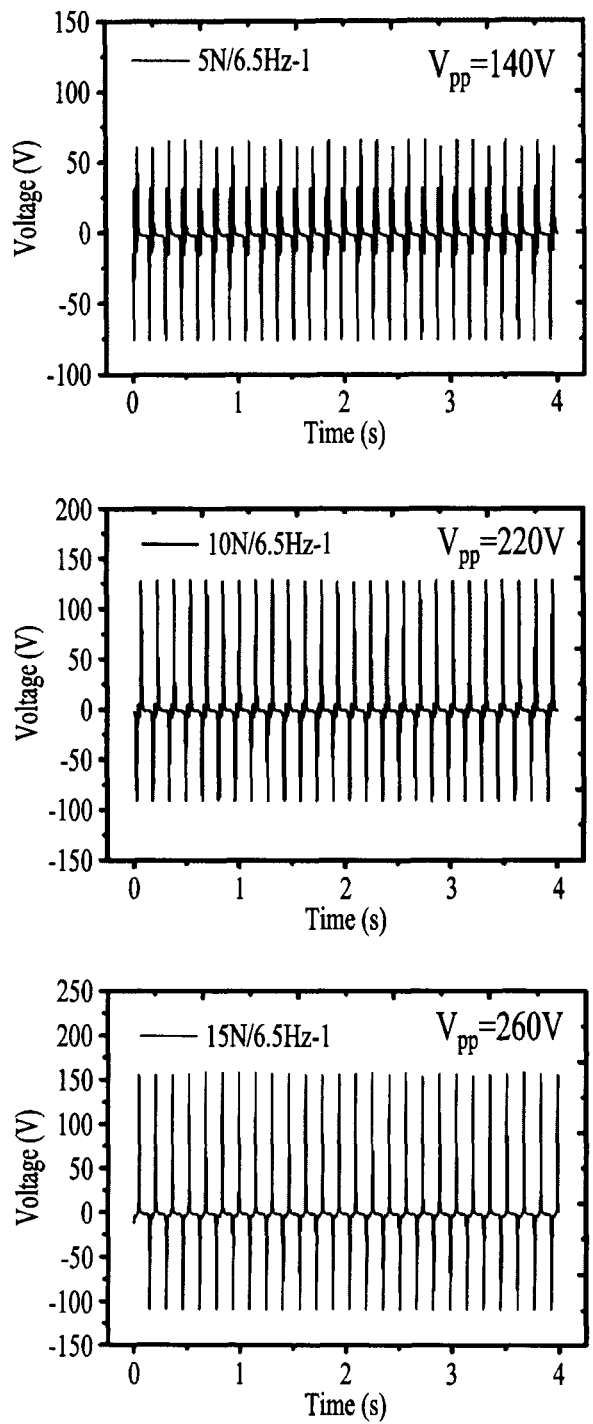
FIG. 7 illustrates applied pressure-dependent output voltages of the triboelectric self-generating device included in the self-generating pressure-sensitive light-emitting device according to an embodiment of the present invention.
Figure 8:
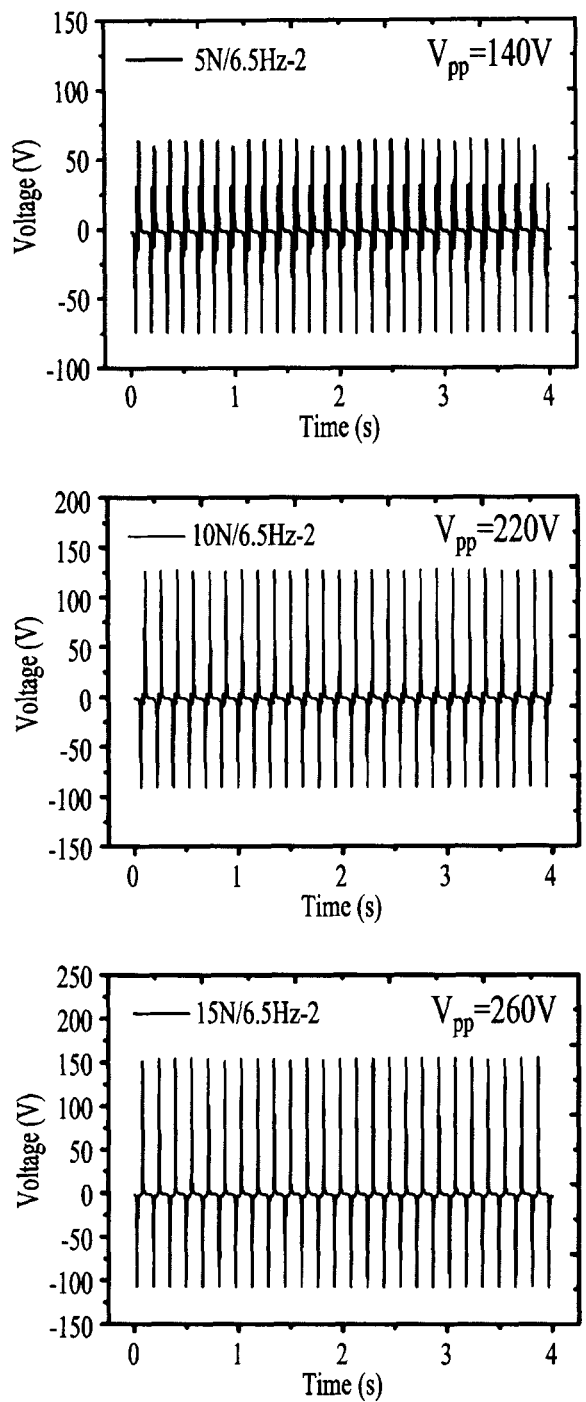
FIG. 8 illustrates voltages applied to the first and third electrodes of the self-generating pressure-sensitive light-emitting device according to an embodiment of the present invention.
Figure 9:
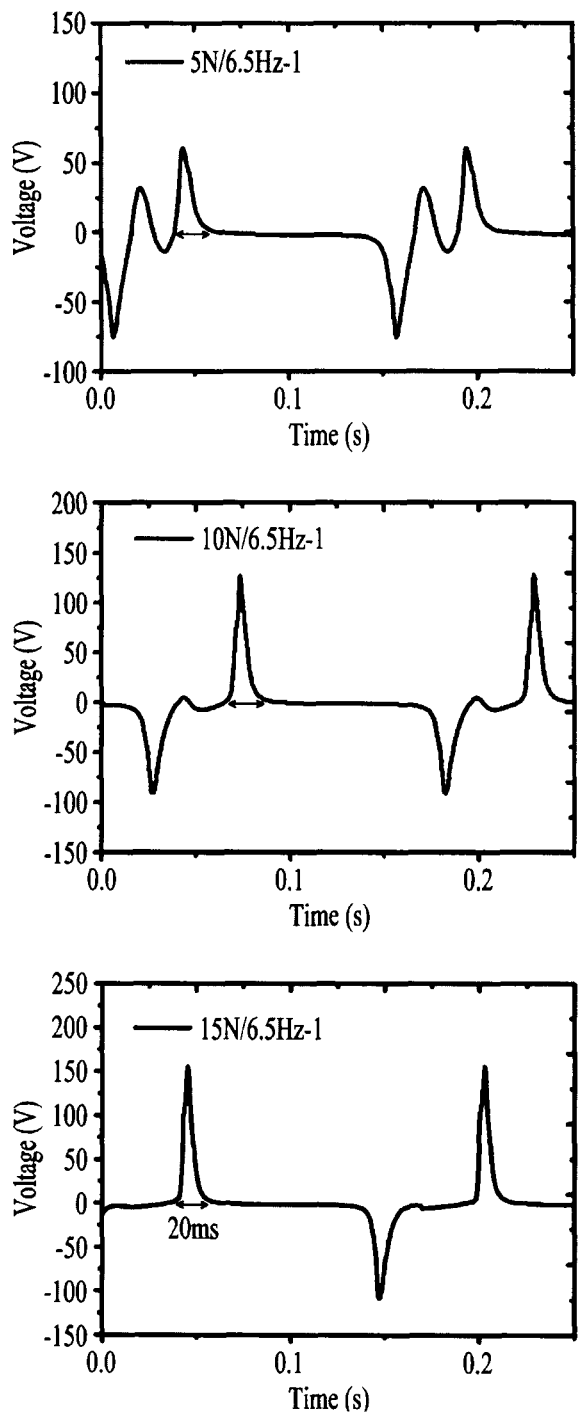
FIG. 9 illustrates the duration of the output voltage of the triboelectric self-generating device included in the self-generating pressure-sensitive light-emitting device according to an embodiment of the present invention.

FIG. 7 illustrates applied pressure-dependent output voltages of the triboelectric self-generating device included in the self-generating pressure-sensitive light-emitting device according to an embodiment of the present invention, FIG. 8 illustrates voltages applied to the first and third electrodes of the self-generating pressure-sensitive light-emitting device according to an embodiment of the present invention, and FIG. 9 illustrates the duration of the output voltage of the triboelectric self-generating device included in the self-generating pressure-sensitive light-emitting device according to an embodiment of the present invention.

Referring to FIGS. 7 and 8, it can be seen that, as the pressure applied to the triboelectric self-generating device included in the self-generating pressure-sensitive light-emitting device according to an embodiment of the present invention increases, the output voltage (sensitivity>1.2V/kPa) changes, and the voltage applied to the first and third electrodes of the self-generating pressure-sensitive light-emitting device according to an embodiment of the present invention also changes similarly.

Accordingly, in the triboelectric self-generating device included in the self-generating pressure-sensitive light-emitting device according to an embodiment of the present invention, ion diffusion and ion concentration gradient in the positively charged layer including the first solid electrolyte are induced depending upon applied pressure, so that the output voltage is adjusted.

Referring to FIG. 9, as the pressure applied to the triboelectric self-generating device included in the self-generating pressure-sensitive light-emitting device according to an embodiment of the present invention increases, an output change is exhibited, but it is difficult for oxidation/reduction reactions to occur effectively in the electrochemical light-emitting device due to a relatively short output duration of 20 ms, so luminescence characteristics may not be exhibited.

Figure 10:
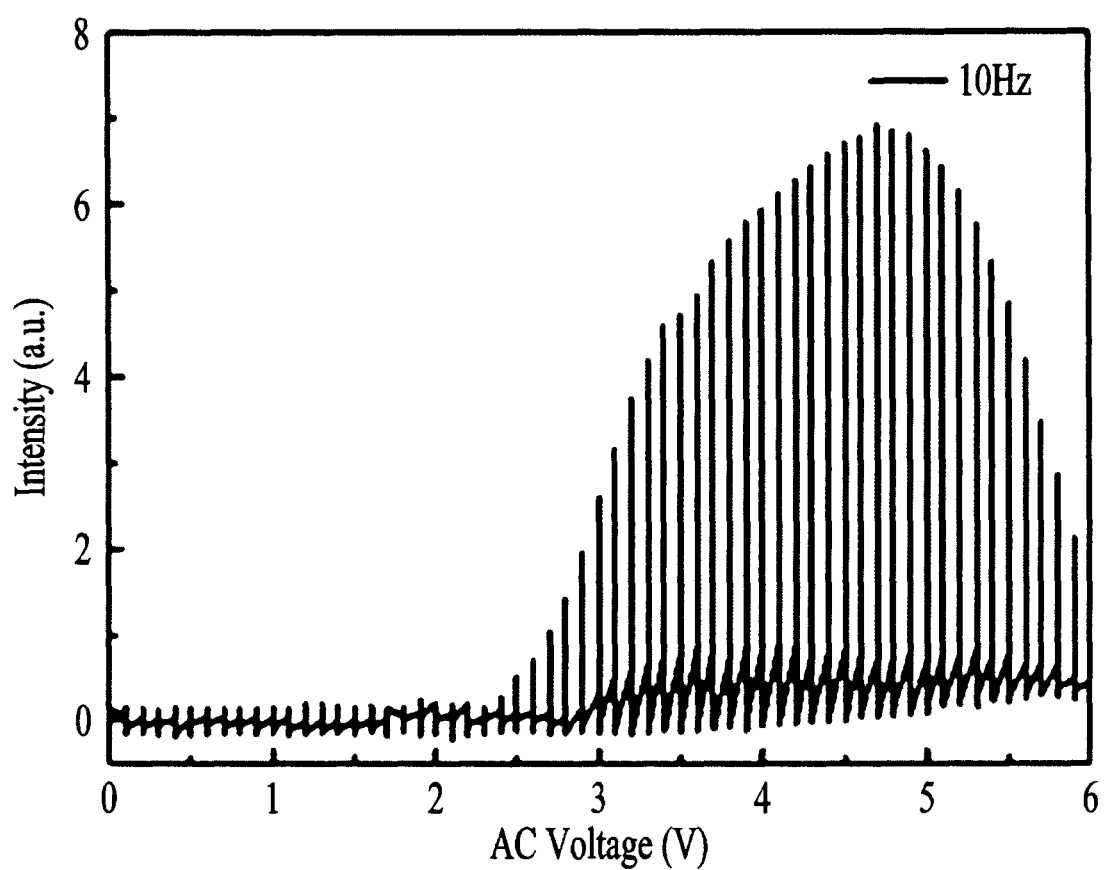
FIG. 10 illustrates a relative luminous intensity dependent upon a voltage applied to the electrochemical light-emitting device included in the self-generating pressure-sensitive light-emitting device according to an embodiment of the present invention.
Figure 11:
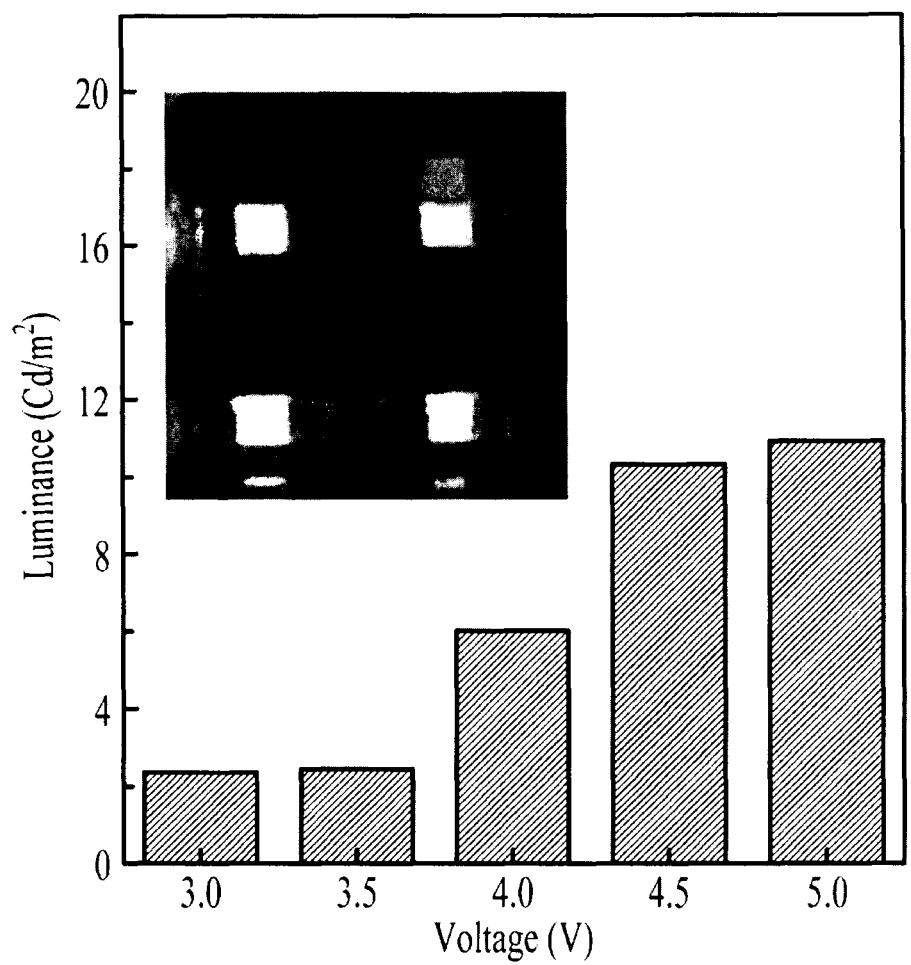
FIG. 11 illustrates quantitative luminous intensity dependent upon the voltage applied to the electrochemical light-emitting device included in the self-generating pressure-sensitive light-emitting device of FIG. 10.

FIG. 10 illustrates a relative luminous intensity dependent upon a voltage applied to the electrochemical light-emitting device included in the self-generating pressure-sensitive light-emitting device according to an embodiment of the present invention, and FIG. 11 illustrates quantitative luminous intensity dependent upon the voltage applied to the electrochemical light-emitting device included in the self-generating pressure-sensitive light-emitting device of FIG. 10.

Since the luminous intensity of the electrochemical light-emitting device is controlled depending upon voltage applied thereto as shown in FIG. 10, it can be seen from FIG. 11 that the activation concentration of the transition metal complex included the light-emitting layer of the electrochemical light-emitting device of the self-generating pressure-sensitive light-emitting device according to an embodiment of the present invention is adjusted as the voltage output from the triboelectric self-generating device increases, so that the luminous intensity increases.

FIGS. 12 to 17 illustrate the capacitance-dependent output voltage and output duration of the capacitor layer included in the self-generating pressure-sensitive light-emitting device according to an embodiment of the present invention.

Figure 12:
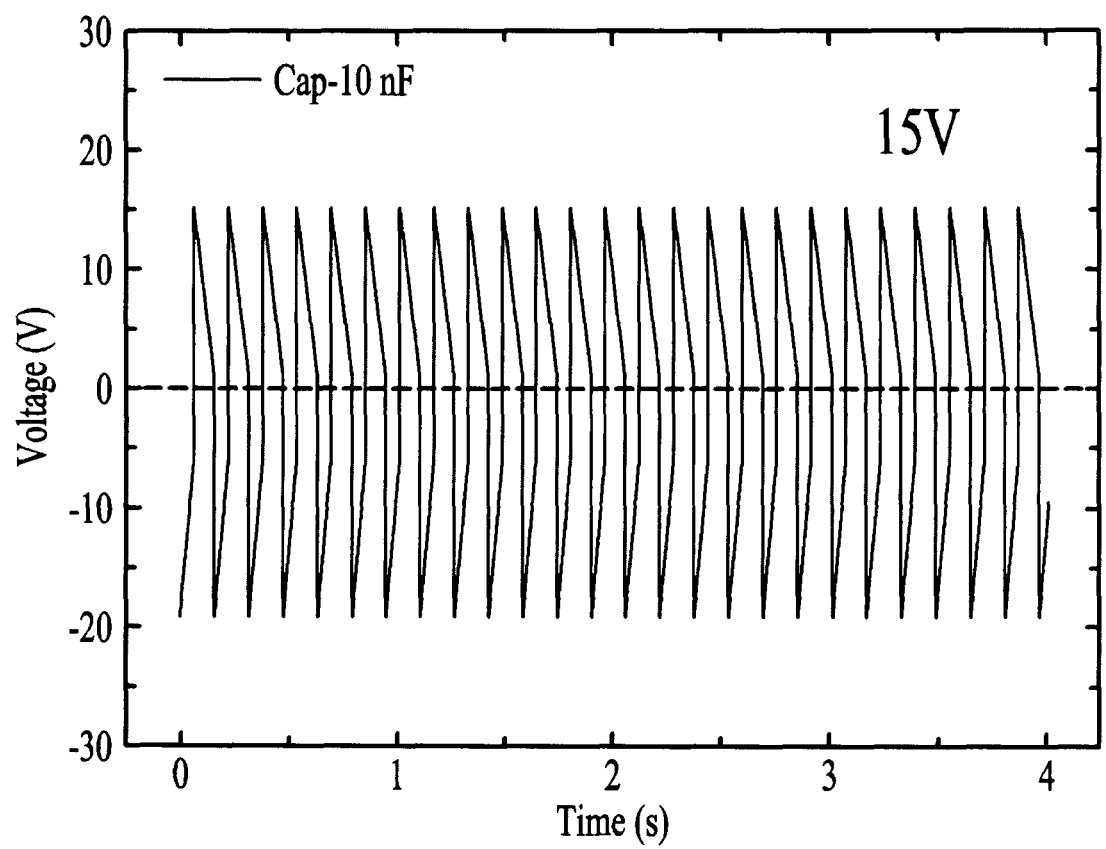
FIGS. 12 to 17 illustrate the capacitance-dependent output voltage and output duration of the capacitor layer included in the self-generating pressure-sensitive light-emitting device according to an embodiment of the present invention.
Figure 13:
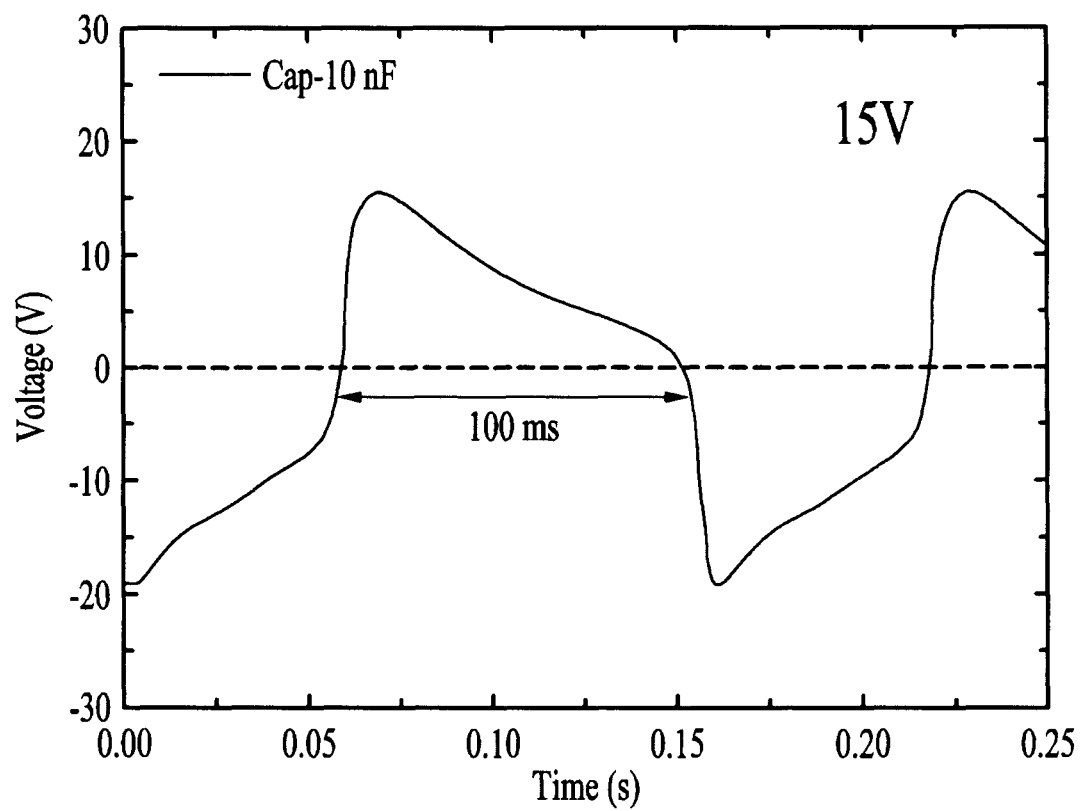

FIG. 12 illustrates an output voltage of 15 V and an output duration of 100 ms when the capacitance of the capacitor layer is 10 nF, and FIG. 13 is an enlarged view of FIG. 12.

Referring to FIGS. 12 and 13, the 15 V output voltage causes too much charge to be injected into the oxidation/reduction species of the transition metal complex and the first ionic liquids, so there is a problem in that the transition metal complex and the first ionic liquids are not stably maintained. Accordingly, the output voltage should be adjusted according to the capacitance of the capacitor layer.

Figure 14:
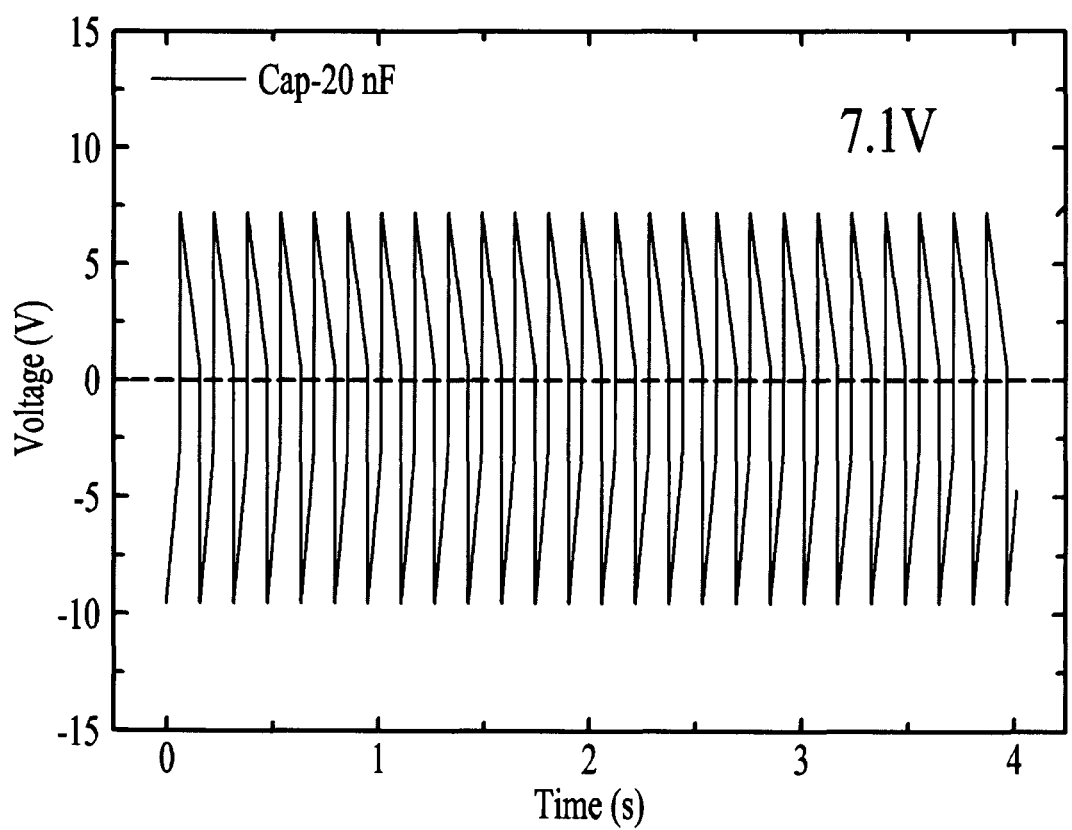
Figure 15:
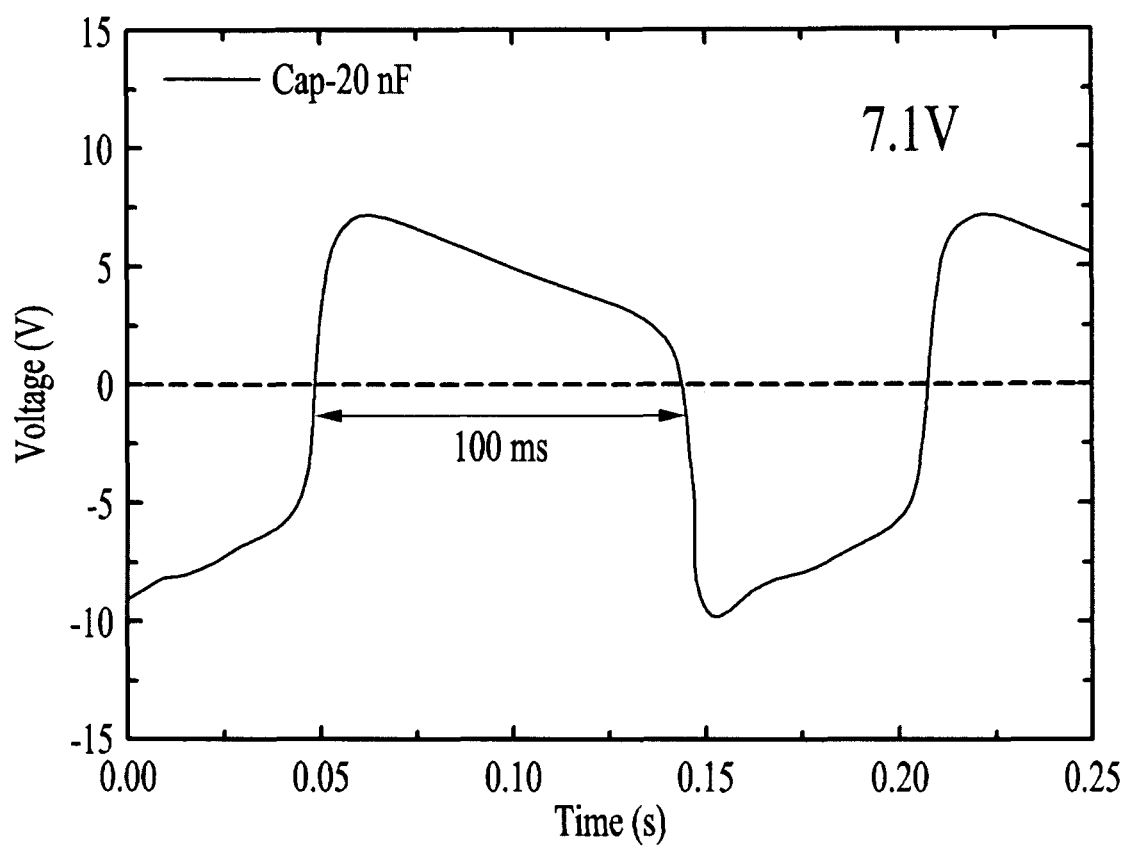
Figure 16:
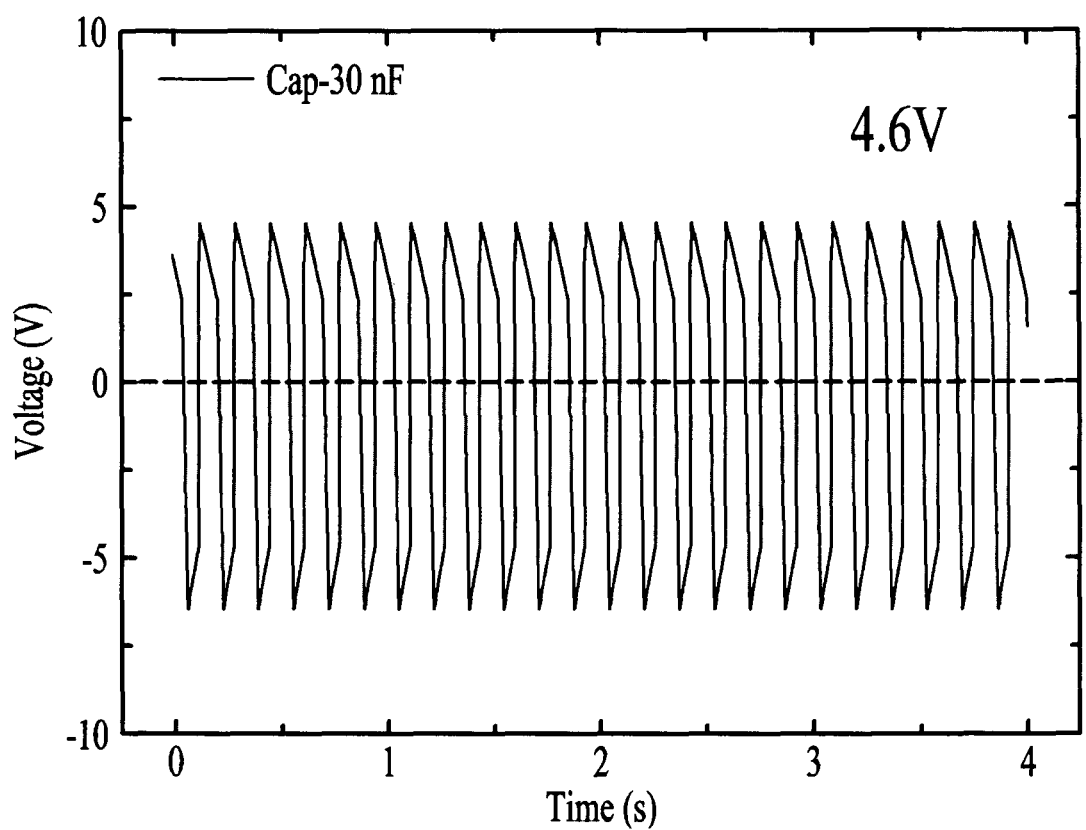
Figure 17:
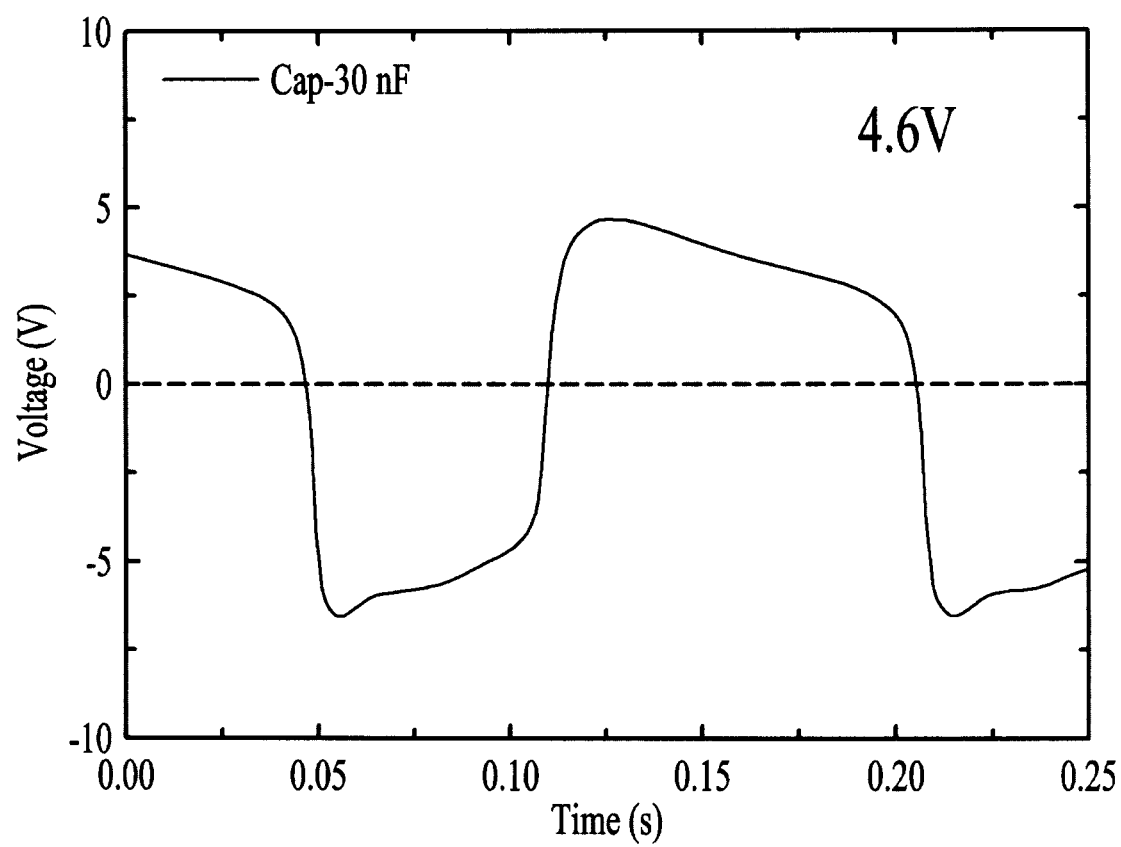

FIG. 14 illustrates an output voltage of 7.1 V and an output duration of 100 ms when the capacitance of the capacitor layer is 20 nF, FIG. 15 is an enlarged view of FIG. 14, FIG. 16 illustrates an output voltage of 4.6 V and an output duration of 100 ms when the capacitance of the capacitor layer is 30 nF, and FIG. 17 is an enlarged view of FIG. 16.

Referring to FIGS. 14 to 17, it can be seen that the electrochemical light-emitting device maintains stable light emission. In addition, it can be seen that a constant voltage is output during the output duration.

Meanwhile, embodiments of the present invention disclosed in the present specification and drawings are only provided to help understanding of the present invention and the scope of the present invention is not limited to the embodiments. It will be apparent to those skilled in the art that various modifications can be made to the above-described exemplary embodiments of the present invention without departing from the spirit or scope of the invention.

The invention claimed is:

1. A self-generating pressure-sensitive light-emitting device comprising:
   an electrochemical light-emitting device including a first electrode, a light-emitting layer and a second electrode having a first region and a second region thereof, wherein the first electrode, the light-emitting layer and the second electrode are sequentially disposed;
   a triboelectric self-generating device including the first region of the second electrode, a positively charged layer and a charge trapping layer, the triboelectric self-generating device being formed on the second electrode so as to share the second electrode with the electrochemical light-emitting device; and
   a capacitor layer formed on the second region of the second electrode,
   wherein the positively charged layer is disposed on the charge trapping layer such that the charge trapping layer forms an interface between the second electrode and the positively charged layer,
   wherein the charge trapping layer confines charges such that an output duration and a luminous intensity of the electrochemical light-emitting device are increased,
   wherein the capacitor layer is configured to regulate an output voltage and the output duration of the electrochemical light-emitting device,
   wherein an increase in capacitance of the capacitor layer causes a decrease of the output voltage of the electrochemical light-emitting device and an introduction of the capacitor layer causes an extension of the output duration, and
   wherein the introduction of the capacitor layer increases a charge retention time of the second electrode, thereby extending the output duration within a range of 20 ms to 100 ms, such that oxidation/reduction reactions occur within the self-generating pressure-sensitive light-emitting device and the luminous intensity is increased.

2. The self-generating pressure-sensitive light-emitting device according to claim 1, wherein power generated from the triboelectric self-generating device depending upon external force is transmitted to the electrochemical light-emitting device.

3. The self-generating pressure-sensitive light-emitting device according to claim 1, wherein the luminous intensity of the electrochemical light-emitting device is adjusted depending upon a potential difference generated from the triboelectric self-generating device.

4. The self-generating pressure-sensitive light-emitting device according to claim 1, wherein the light-emitting layer comprises a first solid electrolyte,
   wherein the first solid electrolyte comprises a transition metal complex, a first ionic liquid and a first elastomer.

5. The self-generating pressure-sensitive light-emitting device according to claim 4, wherein a concentration of the first ionic liquid is 70 wt % to 85 wt % based on a total content of the first ionic liquid and the first elastomer.

6. The self-generating pressure-sensitive light-emitting device according to claim 1, wherein the self-generating pressure-sensitive light-emitting device further comprises a third electrode including a first region and a second region thereof, and the triboelectric self-generating device further comprises:
   a negatively charged layer formed on the positively charged layer; and
   the first region of the third electrode formed on the negatively charged layer.

7. The self-generating pressure-sensitive light-emitting device according to claim 6, further comprising a capacitor formed on the second region of the second electrode,
   wherein the capacitor comprises:
   the second region of the second electrode;
   the capacitor layer formed on the second region of the second electrode; and
   the second region of the third electrode formed on the capacitor layer;
   wherein the capacitor shares the third electrode with the triboelectric self-generating device while sharing the second electrode with the electrochemical light-emitting device.

8. The self-generating pressure-sensitive light-emitting device according to claim 7, wherein the capacitor layer further comprises a third solid electrolyte, and
   the third solid electrolyte comprises a third ionic liquid and a third elastomer.

9. The self-generating pressure-sensitive light-emitting device according to claim 8, wherein a concentration of the third ionic liquid is 40 wt % to 80 wt % based on a total content of the third ionic liquid and the third elastomer.

10. The self-generating pressure-sensitive light-emitting device according to claim 1, wherein the positively charged layer of the triboelectric self-generating device comprises a second solid electrolyte,
    wherein the second solid electrolyte comprises a second ionic liquid and a second elastomer.

11. The self-generating pressure-sensitive light-emitting device according to claim 10, wherein a concentration of the second ionic liquid is 5 wt % to 15 wt % based on a total content of the second ionic liquid and the second elastomer.

12. The self-generating pressure-sensitive light-emitting device according to claim 1, wherein the charge trapping layer comprises at least of reduced graphene oxide (rGO), graphene oxide (GO), aromatic polystyrene and aromatic polyimide.

13. A method of manufacturing a self-generating pressure-sensitive light-emitting device, the method comprising:
    forming a first electrode on a substrate;
    forming a light-emitting layer on the first electrode;
    forming a second electrode on the light-emitting layer, wherein the second electrode includes a first region and a second region thereof;
    forming a positively charged layer on the first region of the second electrode;
    forming a negatively charged layer on the positively charged layer;

forming a charge trapping layer as an interface between the first region of the second electrode and the positively charged layer, wherein the charge trapping layer comprises reduced graphene oxide (rGO) or graphene oxide (GO) and is configured to confine charges at the interface to increase an output duration and a luminous intensity of the self-generating pressure-sensitive light-emitting device;

forming a capacitor layer on the second region of the second electrode; and forming a third electrode on the negatively charged layer and the capacitor layer, wherein the capacitor layer comprises a third solid electrolyte, the third solid electrolyte including a third ionic liquid and a third elastomer, and wherein a concentration of the third ionic liquid is 40 wt % to 80 wt % based on a total content of the third ionic liquid and the third elastomer.

14. The method according to claim 13, wherein the forming of the positively charged layer further comprises forming a charge trapping layer on the first region of the second electrode.

* * * * *